(12) United States Patent  
Hsu et al.

(10) Patent No.: US 12,237,402 B2
(45) Date of Patent: *Feb. 25, 2025

(54) METHODS OF FORMING SEMICONDUCTOR DEVICES

(71) Applicant: Taiwan Semiconductor Manufacturing Company, Ltd., Hsinchu (TW)

(72) Inventors: Shu-Wei Hsu, Taipei (TW); Yu-Jen Shen, Hsinchu (TW); Hao-Yun Cheng, Keelung (TW); Chih-Wei Wu, Hsinchu (TW); Ying-Tsung Chen, Hsinchu (TW); Ying-Ho Chen, Taipei (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,780

(22) Filed: Nov. 28, 2022

(65) Prior Publication Data

US 2023/0093717 A1    Mar. 23, 2023

Related U.S. Application Data

(63) Continuation of application No. 16/697,448, filed on Nov. 27, 2019, now Pat. No. 11,515,403.

(51) Int. Cl.
*H01L 21/3105* (2006.01)
*H01L 21/033* (2006.01)
(Continued)

(52) U.S. Cl.
CPC .... *H01L 29/66795* (2013.01); *H01L 21/0337* (2013.01); *H01L 21/31053* (2013.01);
(Continued)

(58) Field of Classification Search
None
See application file for complete search history.

(56) References Cited

U.S. PATENT DOCUMENTS 8,487,378 B2   7/2013  Goto et al.
8,729,634 B2   5/2014  Shen et al.
(Continued)

FOREIGN PATENT DOCUMENTS

CN    108695257 A    10/2018
CN    109873035 A    6/2019
(Continued)

*Primary Examiner* — Xiaoming Liu
(74) *Attorney, Agent, or Firm* — Slater Matsil, LLP

(57) ABSTRACT

In an embodiment, a method includes: forming a fin extending from a substrate; forming a first gate mask over the fin, the first gate mask having a first width; forming a second gate mask over the fin, the second gate mask having a second width, the second width being greater than the first width; depositing a first filling layer over the first gate mask and the second gate mask; depositing a second filling layer over the first filling layer; planarizing the second filling layer with a chemical mechanical polish (CMP) process, the CMP process being performed until the first filling layer is exposed; and planarizing the first filling layer and remaining portions of the second filling layer with an etch-back process, the etch-back process etching materials of the first filling layer, the second filling layer, the first gate mask, and the second gate mask at the same rate.

20 Claims, 50 Drawing Sheets

(51) Int. Cl.
*H01L 21/311* (2006.01)
*H01L 21/3213* (2006.01)
*H01L 21/8238* (2006.01)
*H01L 29/40* (2006.01)
*H01L 29/66* (2006.01)
*H01L 21/265* (2006.01)
*H01L 29/08* (2006.01)

(52) U.S. Cl.
CPC .. *H01L 21/31116* (2013.01); *H01L 21/31144* (2013.01); *H01L 21/32135* (2013.01); *H01L 21/32139* (2013.01); *H01L 21/823821* (2013.01); *H01L 21/823828* (2013.01); *H01L 29/401* (2013.01); *H01L 29/66545* (2013.01); *H01L 21/26513* (2013.01); *H01L 21/823814* (2013.01); *H01L 29/0847* (2013.01); *H01L 29/6656* (2013.01)

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 9,214,358 | B1 | 12/2015 | Lin et al. |
| 10,062,784 | B1 * | 8/2018 | Lee ................. H01L 29/665 |
| 10,679,903 | B2 | 6/2020 | Lin et al. |
| 11,515,403 | B2 * | 11/2022 | Hsu ................. H01L 21/31144 |
| 2012/0088344 | A1 | 4/2012 | van Dal |
| 2014/0282326 | A1 | 9/2014 | Chen et al. |
| 2014/0370697 | A1 | 12/2014 | Chen et al. |
| 2015/0091127 | A1 | 4/2015 | Lee et al. |
| 2016/0155824 | A1 | 6/2016 | Lin et al. |
| 2017/0194210 | A1 | 7/2017 | Oh et al. |

FOREIGN PATENT DOCUMENTS

| | | |
|---|---|---|
| TW | 201628087 A | 8/2016 |
| TW | 201626444 A | 7/2017 |

* cited by examiner

METHODS OF FORMING SEMICONDUCTOR DEVICES

PRIORITY CLAIM AND CROSS-REFERENCE

This application is a continuation of U.S. patent application Ser. No. 16/697,448, filed on Nov. 27, 2019, entitled "Semiconductor Device and Method," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
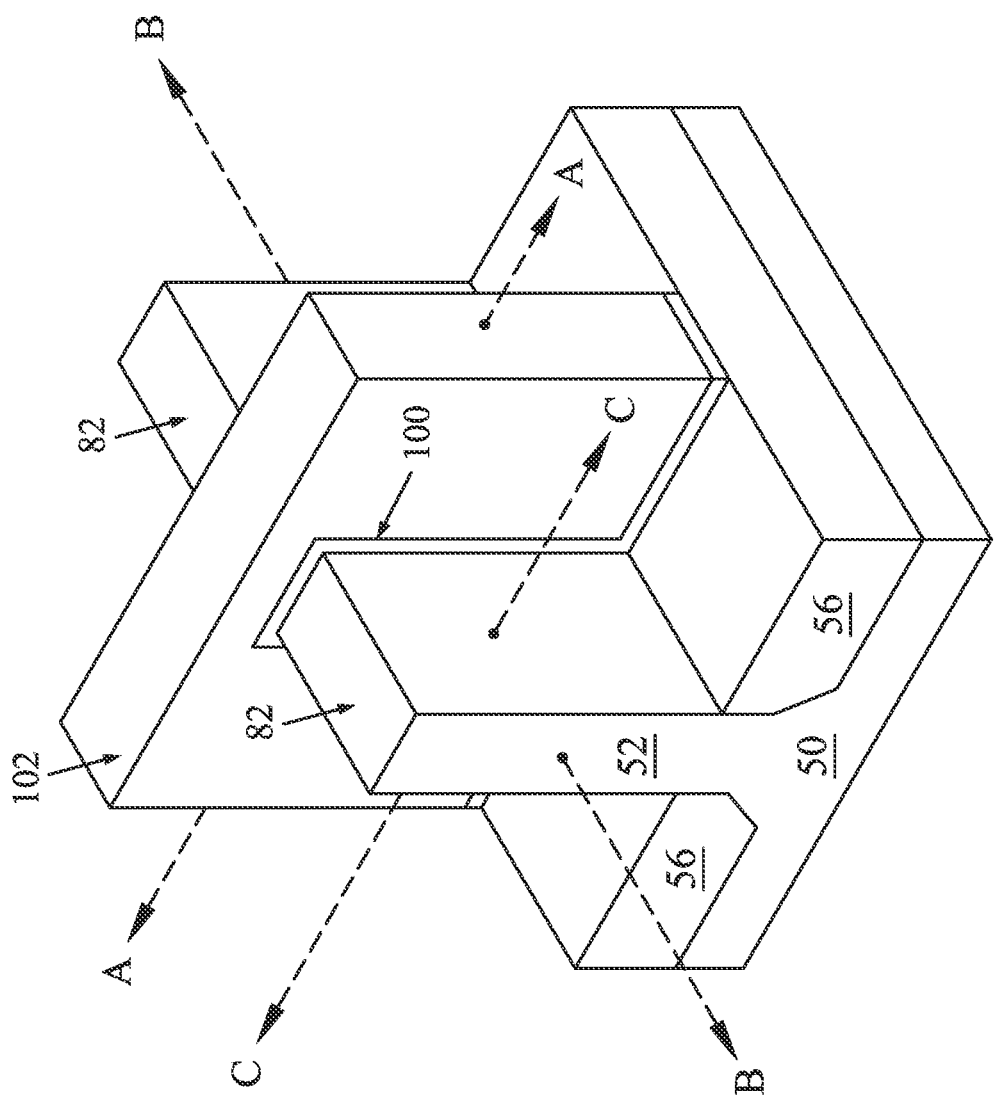
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, FinFETs with channel regions having different lengths are formed. The channel regions of different lengths may be formed with a same semiconductor fin. During a replacement gate process for the FinFETs, pattern loading may occur, resulting in the material layers for the replacement gates having different heights. Gate masks formed to protect the replacement gates may thus also have differing heights. A multi-step planarization process is performed to planarize the gate masks and surrounding interlayer dielectric (ILD) masks. The multi-step planarization process includes a chemical mechanical polish (CMP) process, which is used to reset planarity of the structure, followed by an etch-back process, which is non-selective and etches the gate masks and ILD masks at a same rate. Top surfaces of the gate masks and ILD masks may thus be leveled even when the gate mask pattern is heavily loaded.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric 100 is along sidewalls and over a top surface of the fin 52, and a gate electrode 102 is over the gate dielectric 100. Source/drain regions 82 are disposed in opposite sides of the fin 52 with respect to the gate dielectric 100 and gate electrode 102. FIG. 1 further illustrates reference cross-sections that are used in later figures. Cross-section A-A is along a longitudinal axis of the gate electrode 102 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
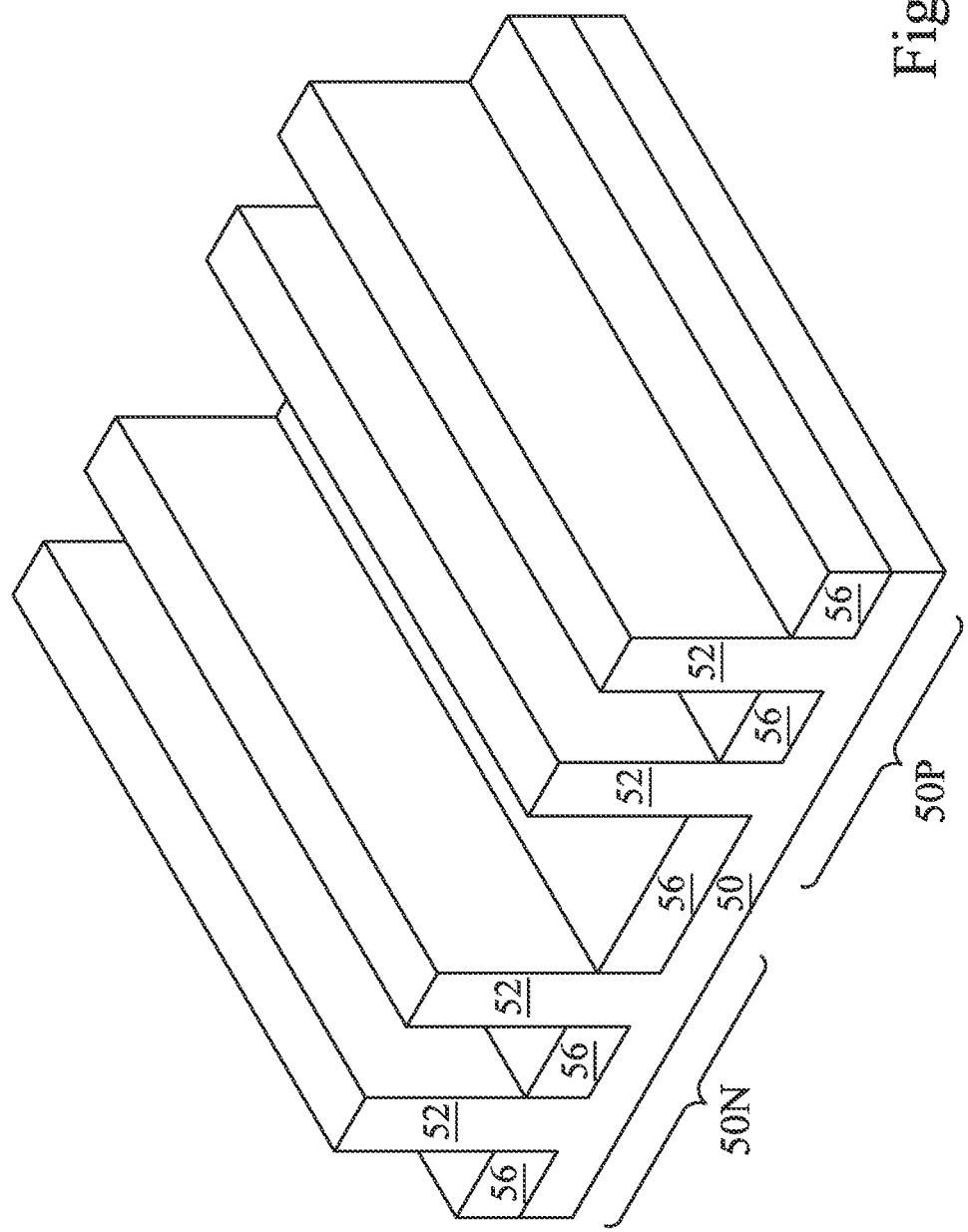
FIGS. 2 through 20B are various views of intermediate stages in the manufacturing of FinFETs, in accordance with some embodiments.
Figure 3:
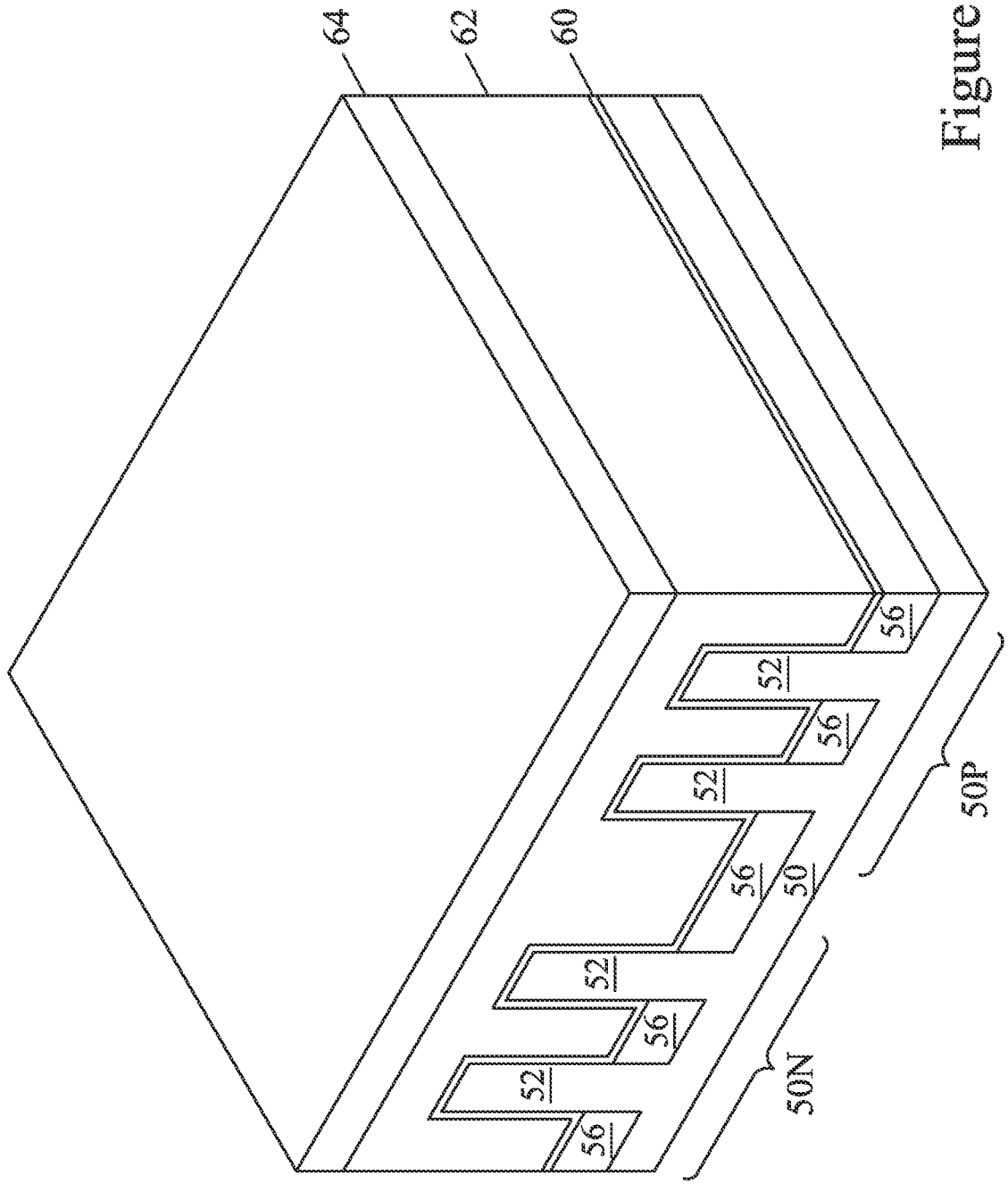

FIGS. 2 through 20B are various views of intermediate stages in the manufacturing of FinFETs, in accordance with some embodiments. FIGS. 2 and 3 are three-dimensional views. FIGS. 4A, 5A, 6A, 7A, 8A, 9A, 10A, 11A, 12A, 13A, 14A, 15A, 16A, 17A, 18A, 19A, and 20A are cross-sectional views illustrated along reference cross-section A-A illustrated in FIG. 1, except for multiple fins/FinFETs. FIGS. 4B, 5B, 6B, 7B, 8B, 9B, 10B, 11B, 12B, 13B, 14B, 15B, 16B, 17B, 18B, 19B, and 20B are cross-sectional views, where figures ending with an "A" designation are illustrated along reference cross-section A-A illustrated in FIG. 1 and along reference cross-section A-A from the corresponding figure ending with a "B" designation, except for multiple fins/FinFETs. FIGS. 5C and 5D are illustrated along reference cross-section C-C illustrated in FIG. 1, except for multiple fins/FinFETs.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P. Figures ending with a "B" designation (discussed below) illustrate features in either of the region 50N and the region 50P. For example, the structures illustrated in the Figures ending with a "B" designation may be applicable to both the region 50N and the region 50P. Differences (if any) in the structures of the region 50N and the region 50P are described in the text accompanying each figure.

Fins 52 are formed on and extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

STI regions 56 are formed over the substrate 50 and between neighboring fins 52. As an example to form the STI regions 56, an insulation material is formed over the substrate 50 and between neighboring fins 52. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Although the insulation material is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are level after the planarization process is complete. In embodiments in which a mask remains on the fins 52, the planarization process may expose the mask or remove the mask such that top surfaces of the mask or the fins 52, respectively, and the insulation material are level after the planarization process is complete. The insulation material is then recessed to form the STI regions 56. The insulation material is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 4A:
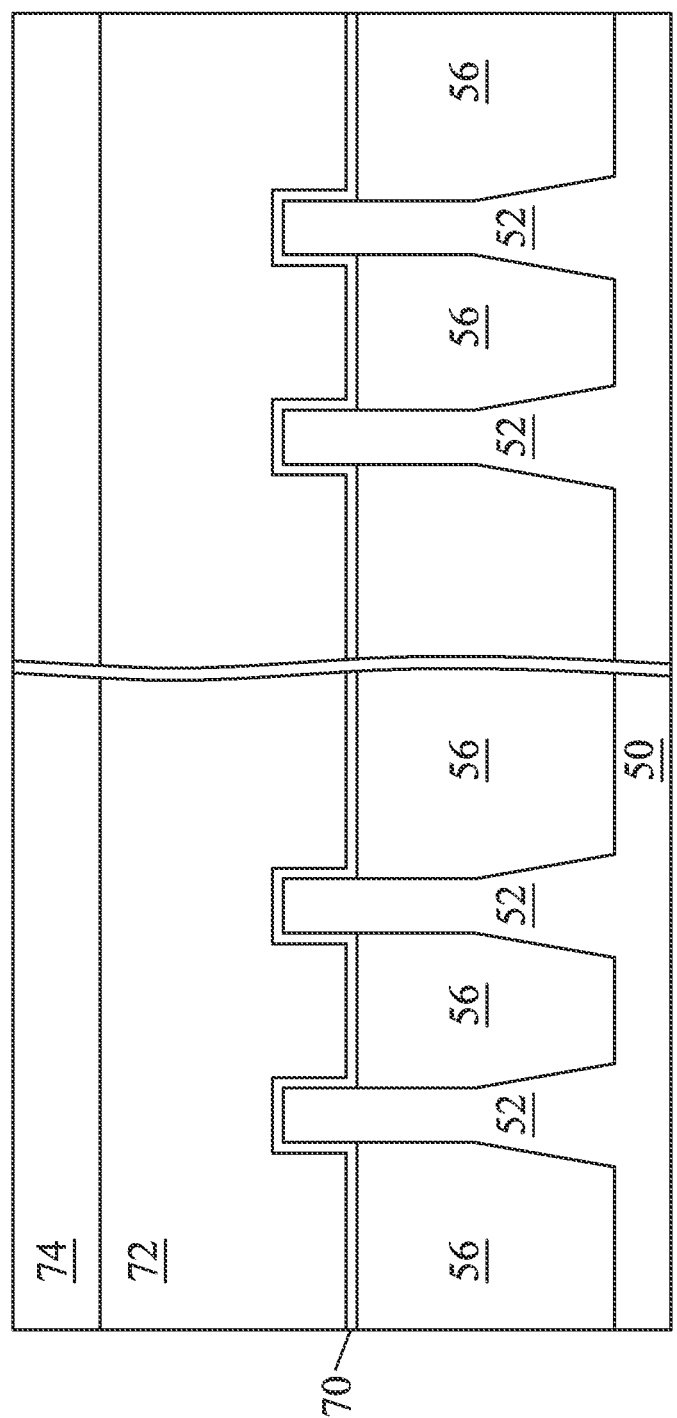
Figure 4B:
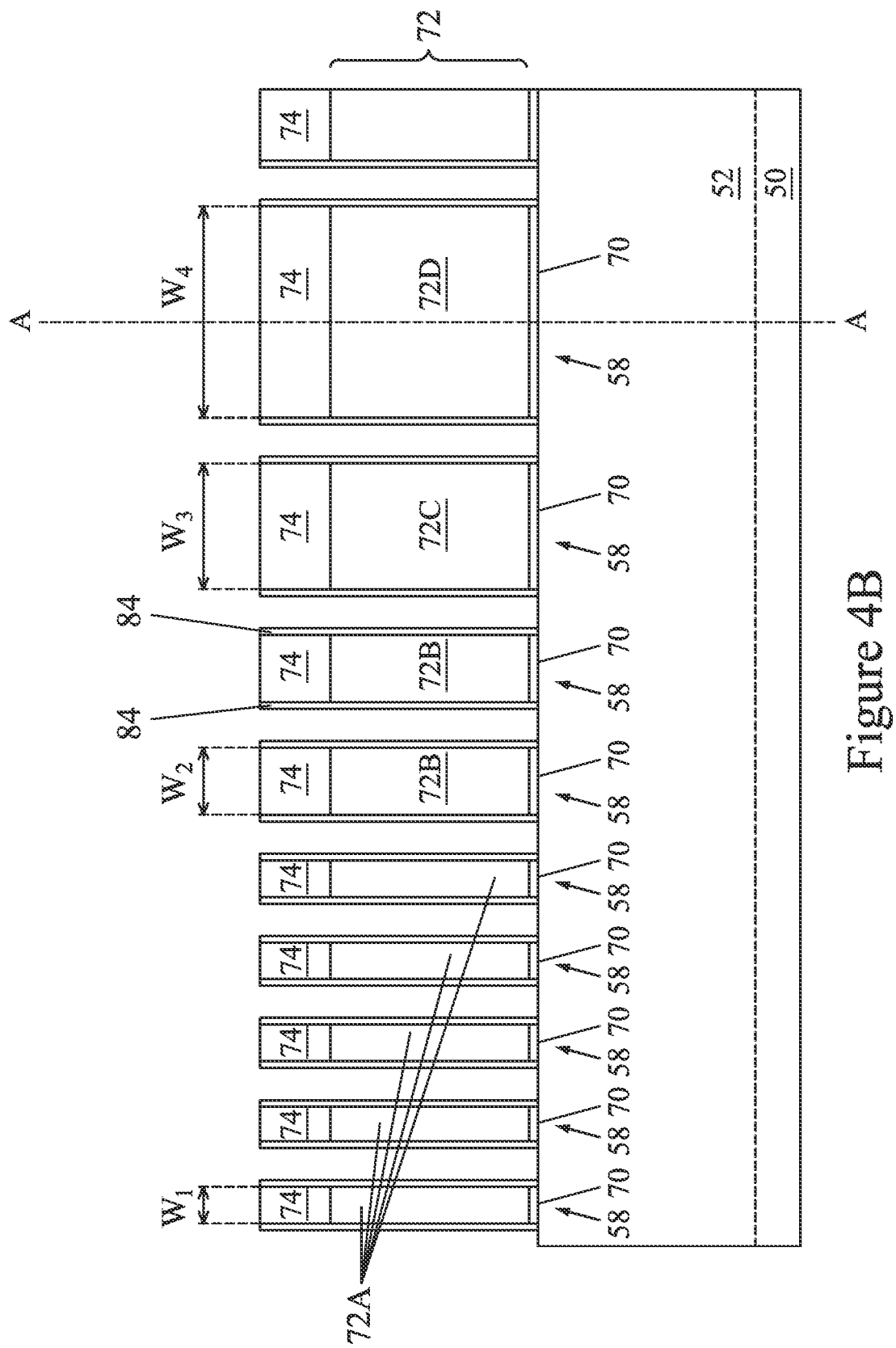

In FIGS. 4A and 4B, the mask layer 64 may be patterned using acceptable photolithography and etching techniques to form masks 74. The pattern of the masks 74 then may be transferred to the dummy gate layer 62 to form dummy gates 72. In some embodiments (not illustrated), the pattern of the masks 74 may also be transferred to the dummy dielectric layer 60 by an acceptable etching technique to form dummy gate dielectrics 70. The dummy gate dielectrics 70 and dummy gates 72 may be collectively referred to as "dummy gate stacks," with each dummy gate stack including a dummy gate dielectric 70 and a dummy gate 72. The dummy gate stacks cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

The dummy gates 72 include dummy gates of different widths. In the example shown, the dummy gates 72 include dummy gates 72A having a first width $W_1$, dummy gates 72B having a greater second width $W_2$, dummy gates 72C having an even greater third width $W_3$, and dummy gates 72D having a still greater fourth width $W_4$. For example, the first width $W_1$ can be in the range of from about 3 nm to about 15 nm, the second width $W_2$ can be in the range of from about 22 nm to about 90 nm, the third width $W_3$ can be in the range of from about 100 nm to about 172 nm, and the fourth width $W_4$ can be in the range of from about 210 nm to about 250 nm. In addition, the masks 74 (and dummy gate dielectrics 70, when patterned) have the same widths $W_1/W_2/W_3/W_4$ as their corresponding dummy gates 72. The varying widths $W_1/W_2/W_3/W_4$ of the dummy gates 72 allows FinFETs with channel regions 58 of varying lengths to be formed. Varying the channel regions 58 lengths allows FinFETs with varying threshold voltages to be formed. The widths $W_1/W_2/W_3/W_4$ of the dummy gates 72 are selected based on the desired threshold voltages of the resulting FinFETs.

Further, implants for lightly doped source/drain (LDD) regions (not explicitly illustrated) may be performed. In the embodiments with different device types, similar to the implants discussed above, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Further, gate spacers 84 are formed along sidewalls of the masks 74 and dummy gates 72 (and dummy gate dielectrics 70 when patterned). The gate spacers 84 are on exposed surfaces of the fins 52. The gate spacers 84 may be formed of an insulating material such as silicon oxide, silicon nitride, silicon oxynitride, silicon carbonitride, a combination thereof, or the like. The material layer(s) for the gate spacers 84 may be conformally formed, such as by thermal oxidation, deposition, or the like, and may then be etched to form the gate spacers 84. The gate spacers 84 may be single-layered or may include multiple layers. For example, the gate spacers 84 may include a gate seal spacer layer and a main gate spacer layer. In some embodiments, the gate spacers 84 are oxide-nitride-oxide structures that include a nitride layer (e.g., formed of silicon nitride) between oxide layers (e.g., formed of silicon oxide).

It is noted that the above disclosure generally describes a process of forming gate spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using different structures and steps.

Figure 5A:
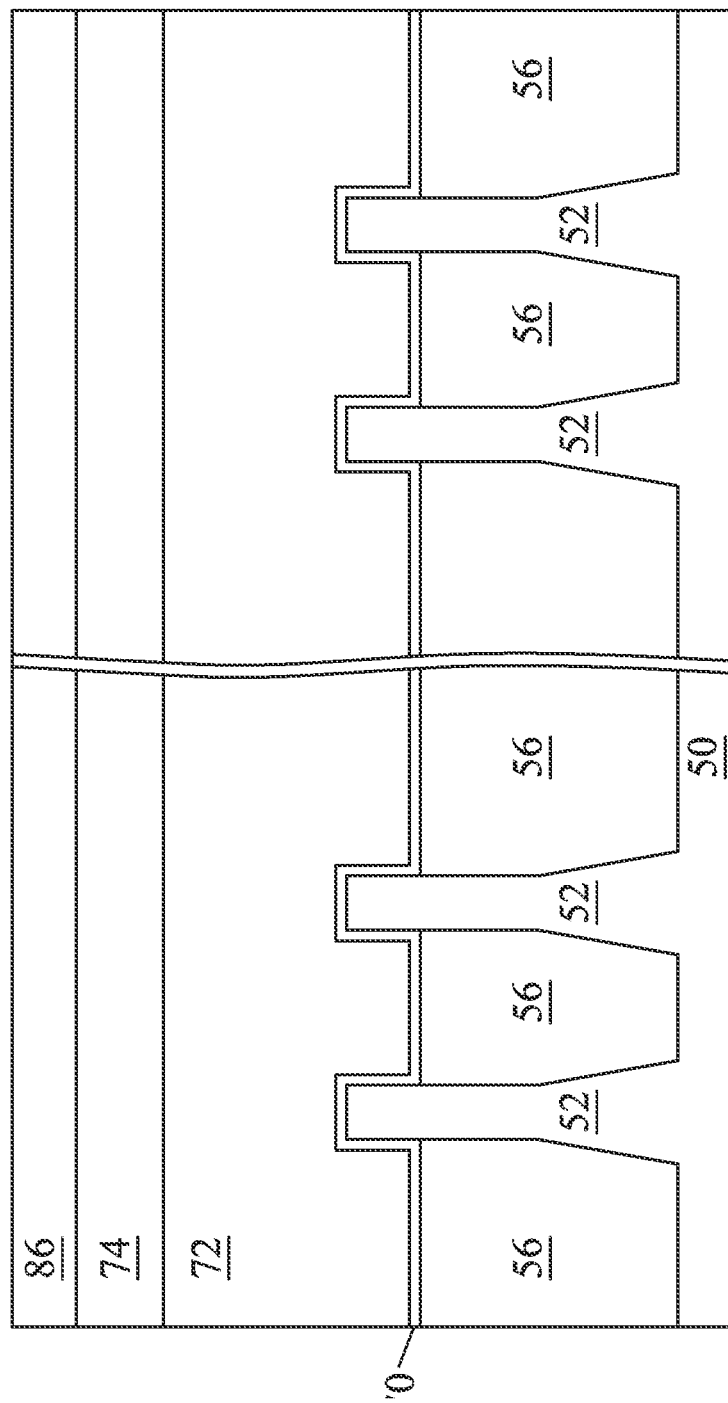
Figure 5B:
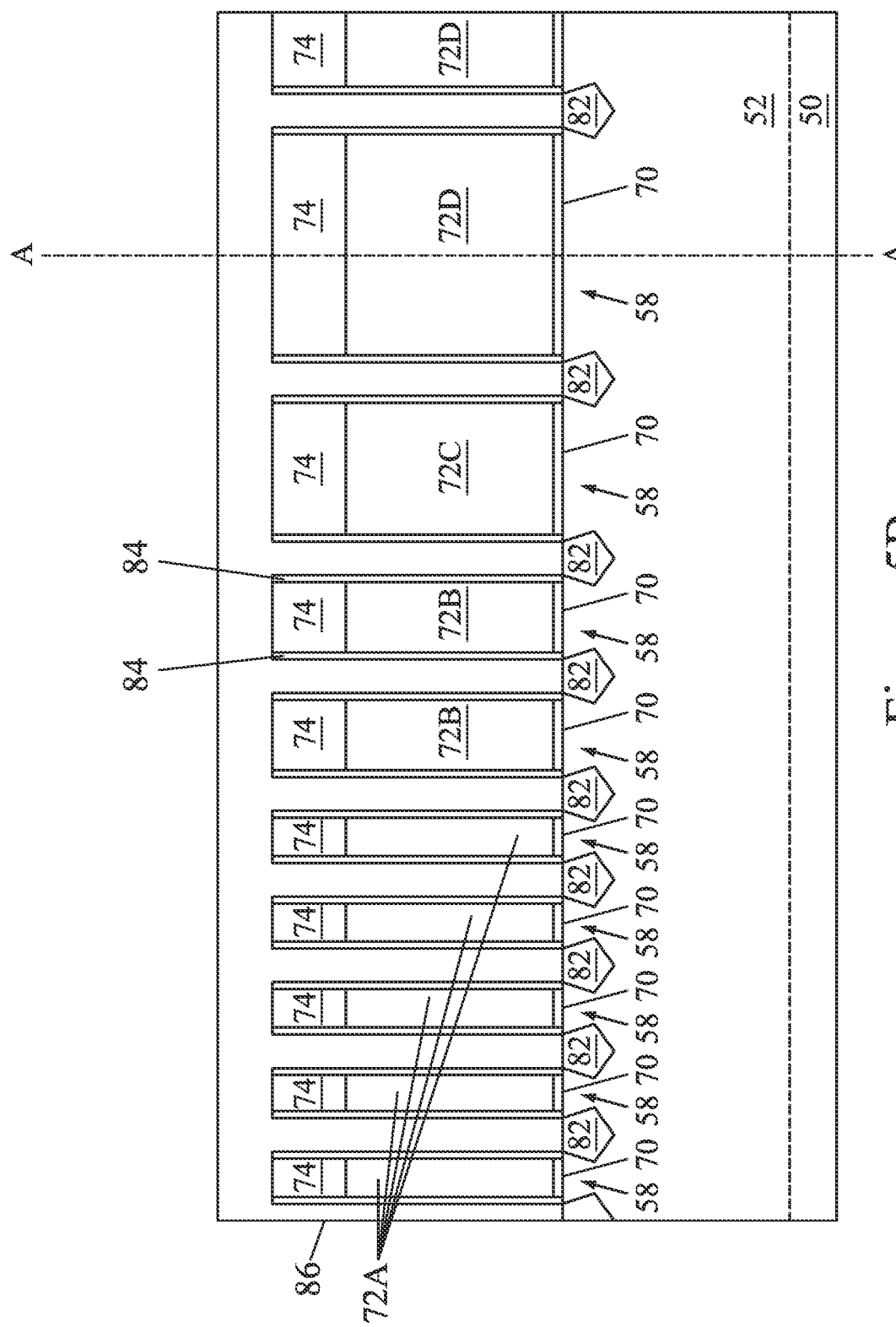
Figure 5C:
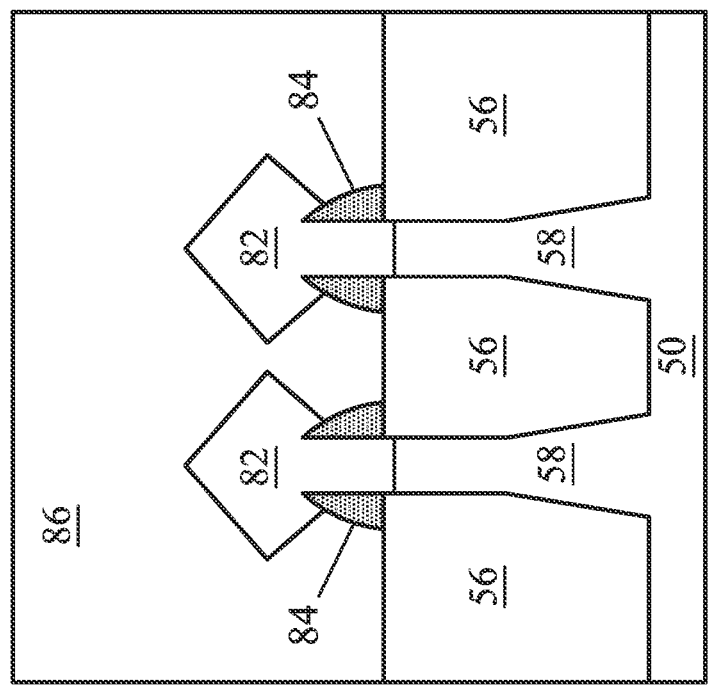
Figure 5D:
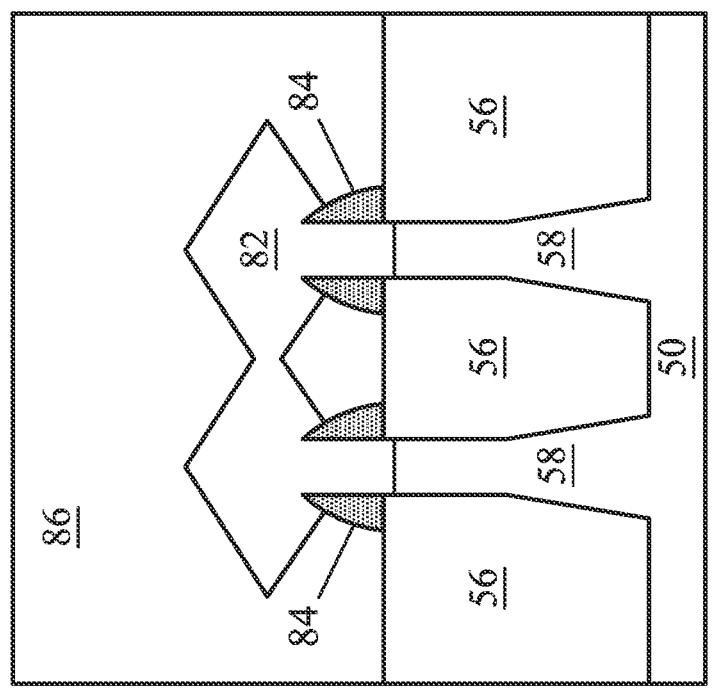

In FIGS. 5A and 5B, epitaxial source/drain regions 82 are formed in the fins 52. The epitaxial source/drain regions 82 may exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 84 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge (as illustrated by FIG. 5C). In other embodiments, adjacent epitaxial source/drain regions 82 remain separated after the epitaxy process is completed (as illustrated by FIG. 5D).

After formation of the epitaxial source/drain regions 82, an ILD 86 is deposited over the intermediate structure. The first ILD 86 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) (not shown) is disposed between the first ILD 86 and the epitaxial source/drain regions 82, the masks 74, and the gate spacers 84. The CESL may comprise a dielectric material, such as, silicon nitride, silicon oxide, silicon oxynitride, or the like, having a different etch rate than the material of the overlying first ILD 86.

Figure 6A:
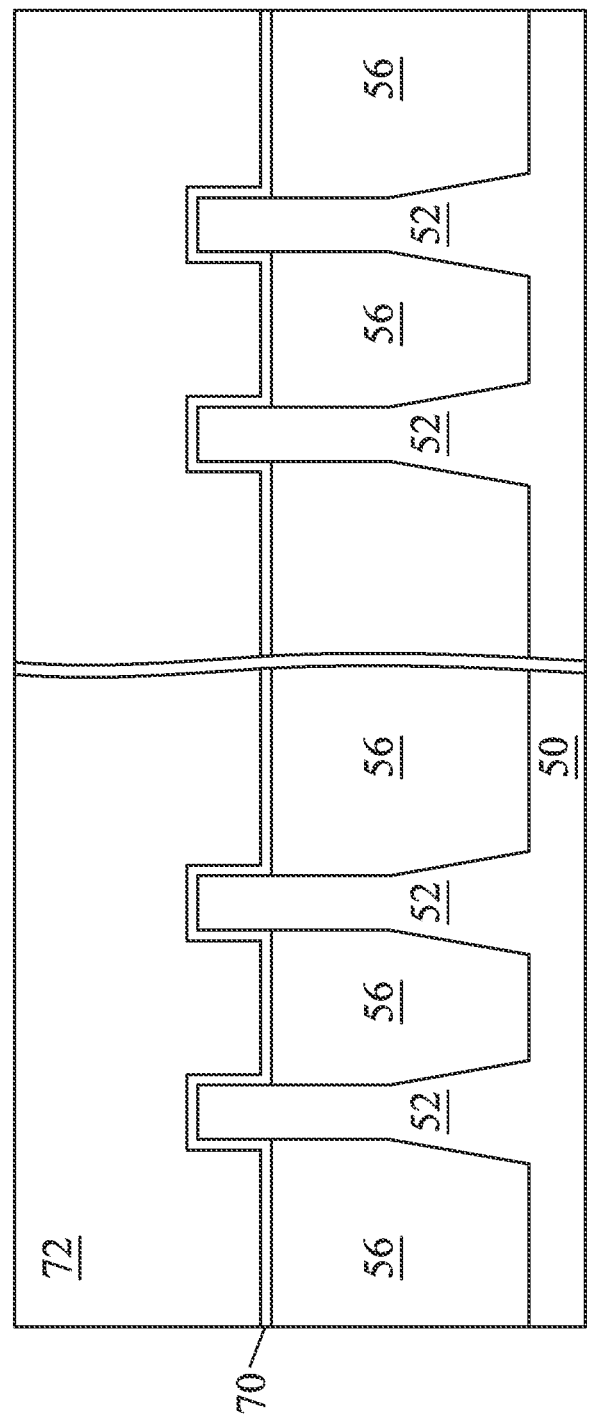
Figure 6B:
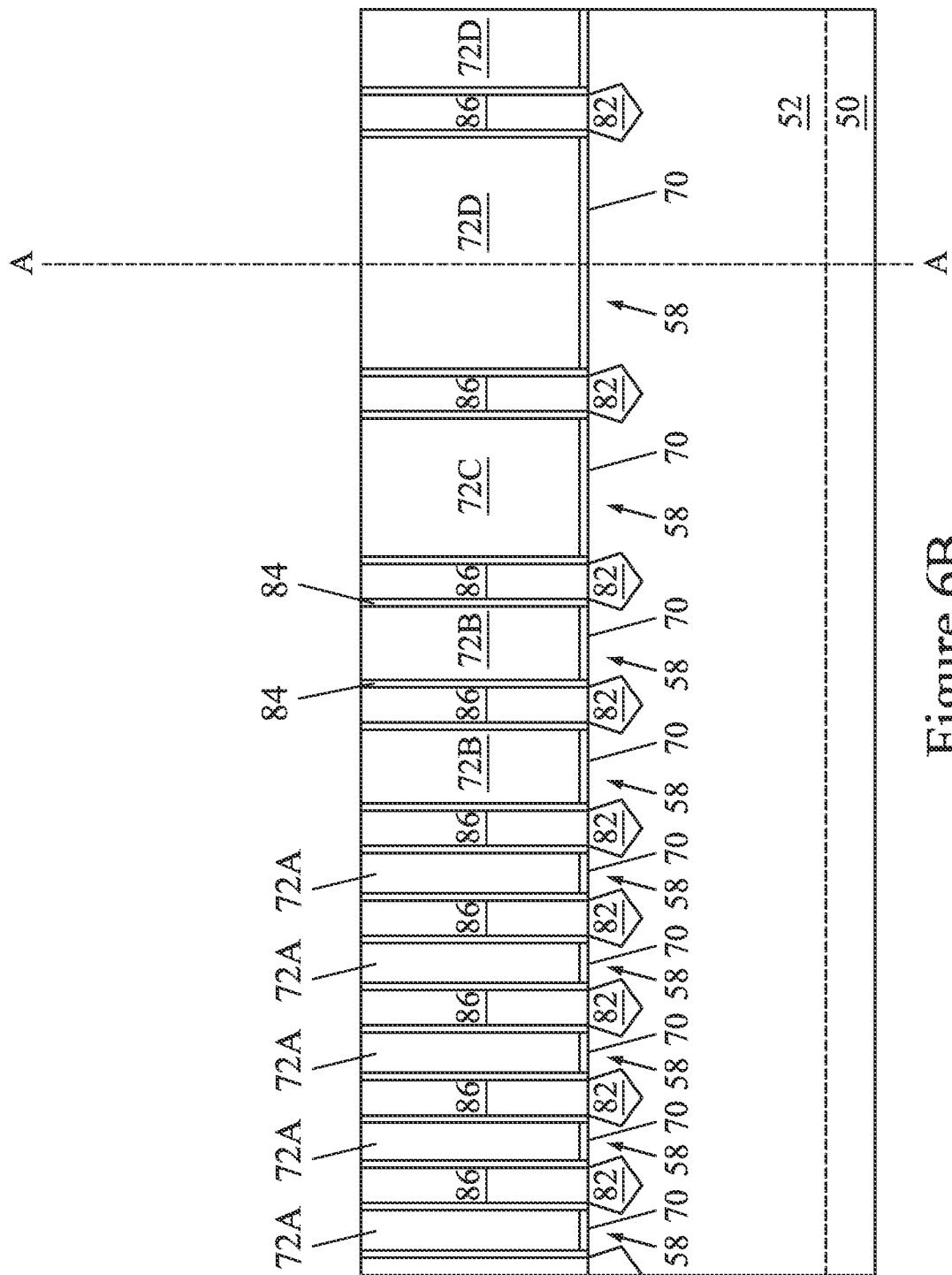

In FIGS. 6A and 6B, a planarization process, such as a CMP, is performed to level the top surface of the first ILD 86 with the top surfaces of the dummy gates 72 or the masks 74. The planarization process may also remove the masks 74 on the dummy gates 72, and portions of the gate spacers 84 along sidewalls of the masks 74. After the planarization process, top surfaces of the dummy gates 72, the gate spacers 84, and the first ILD 86 are level. Accordingly, the top surfaces of the dummy gates 72 are exposed through the first ILD 86. In some embodiments, the masks 74 may remain, in which case the planarization process levels the top surface of the first ILD 86 with the top surfaces of the top surface of the masks 74.

Figure 7A:
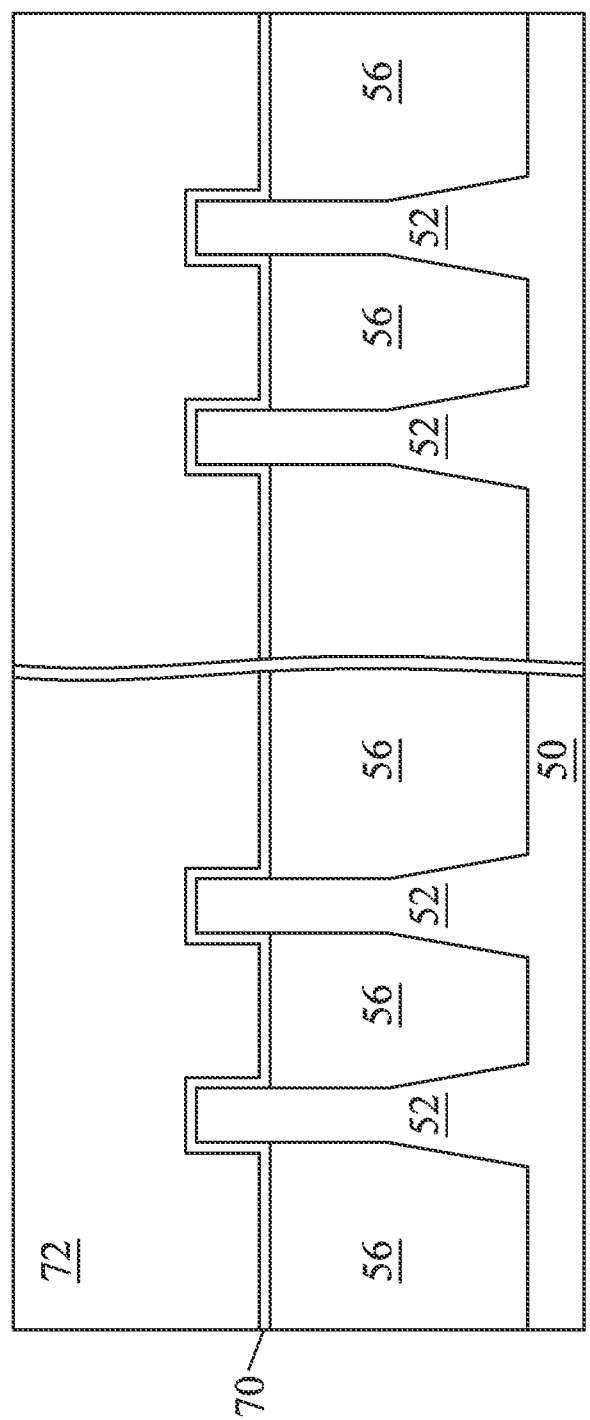
Figure 7B:
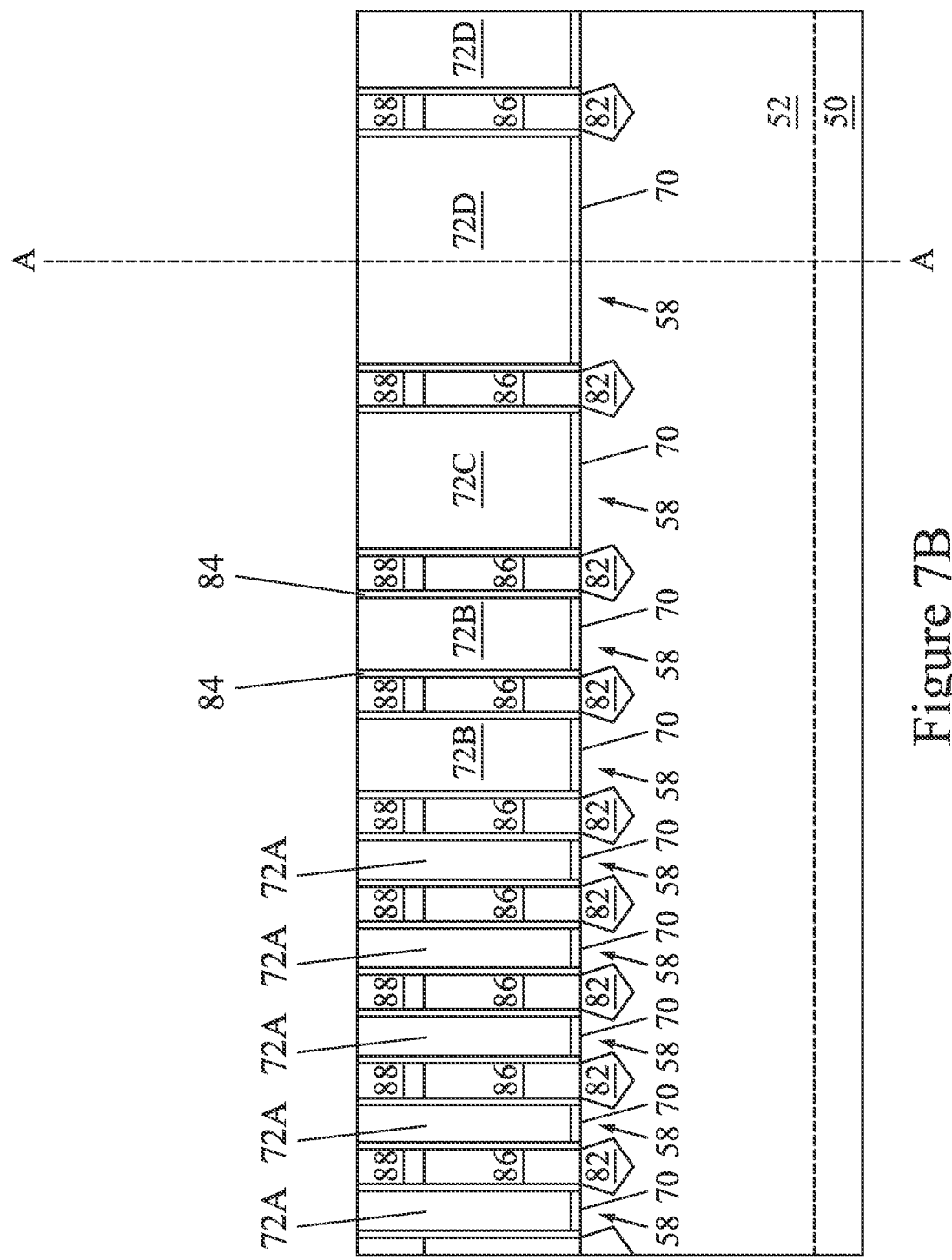

In FIGS. 7A and 7B, ILD masks 88 are formed over the remaining portions of the first ILD 86. In accordance with some embodiments, the first ILD 86 is recessed, so that recesses are formed between opposing ones of the gate spacers 84. The recessing may be any acceptable etch process, such as a wet or dry etch. The ILD masks 88 are formed of one or more layers of dielectric material, such as silicon nitride, silicon oxynitride, or the like. In some embodiments, the ILD masks 88 are a layer of silicon nitride. The ILD masks 88 are formed by filling the recesses in the first ILD 86. A planarization process may then be performed to remove excess portions of the dielectric material extending over the dummy gates 72 and gate spacers 84.

Figure 8A:
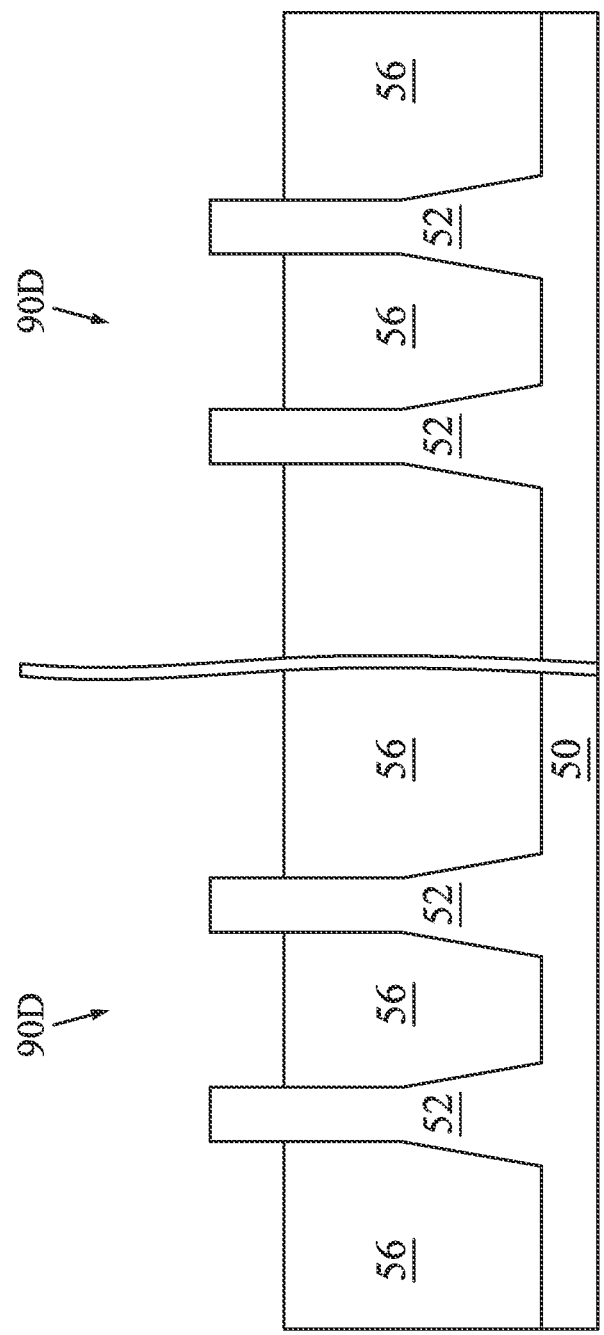
Figure 8B:
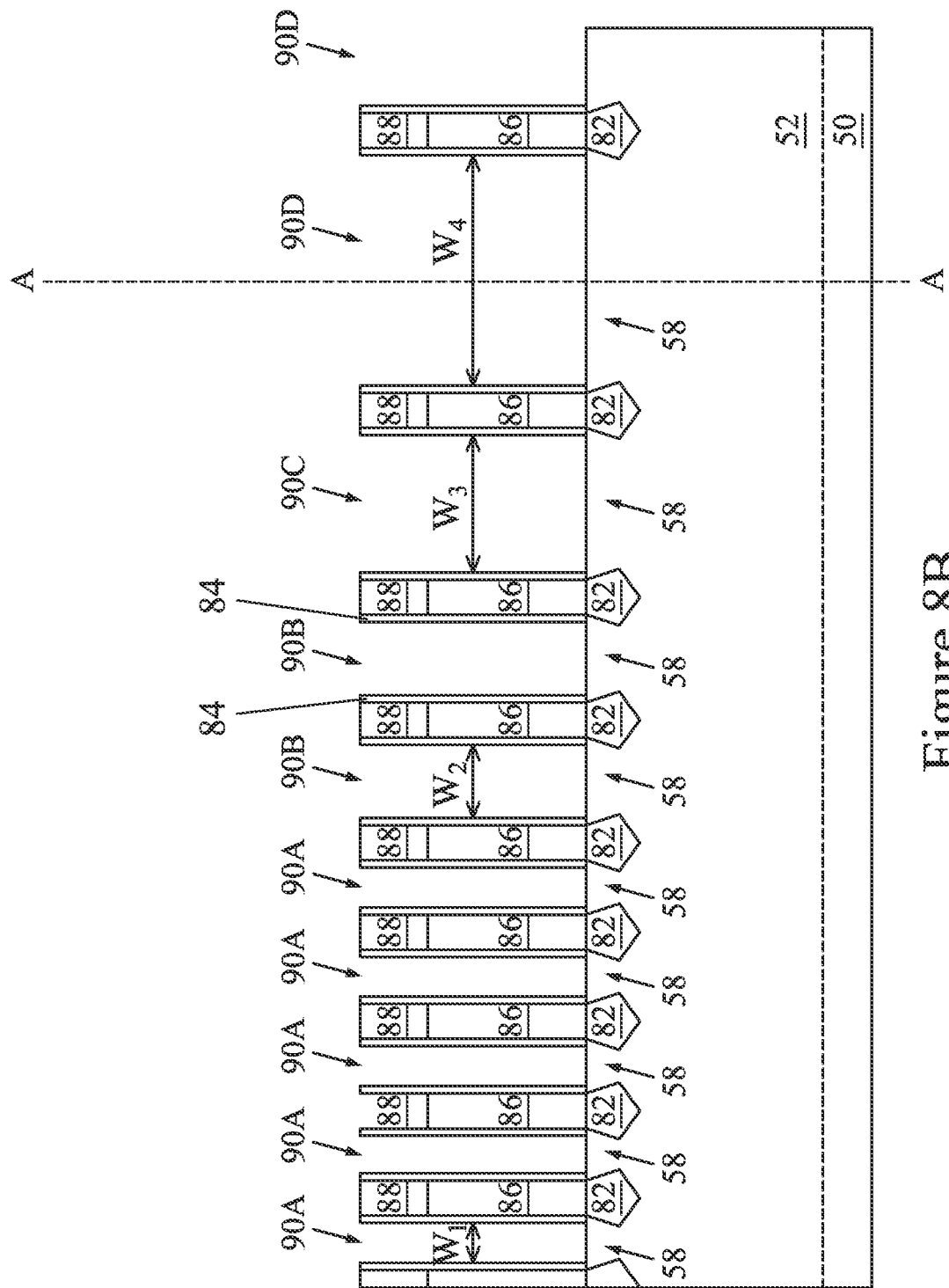

In FIGS. 8A and 8B, the dummy gates 72, and the masks 74 if present, are removed in an etching step(s), so that recesses 90 are formed. The dummy gate dielectrics 70 in the recesses 90 may also be removed. In some embodiments, only the dummy gates 72 are removed and the dummy gate dielectrics 70 remain and are exposed by the recesses 90. In some embodiments, the dummy gate dielectrics 70 are removed from recesses 90 in a first region of a die (e.g., a core logic region) and remain in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the gate spacers 84. The ILD masks 88 protect the first ILD 86 during the etching. Each recess 90 exposes and/or overlies a channel region 58 of a respective fin 52. Each channel region 58 is disposed between neighboring pairs of the epitaxial source/drain regions 82. During the removal, the dummy gate dielectrics 70 may be used as etch stop layers when the dummy gates 72 are etched. The dummy gate dielectrics 70 may then be optionally removed after the removal of the dummy gates 72.

The recesses 90 include recesses of different widths. In the example shown, the recesses 90 include recesses 90A, 90B, 90C, and 90D, corresponding, respectively, to the removed dummy gates 72A, 72B, 72C, and 72D. Similar to the dummy gates 72, the recesses 90 have differing widths $W_1/W_2/W_3/W_4$.

Figure 9A:
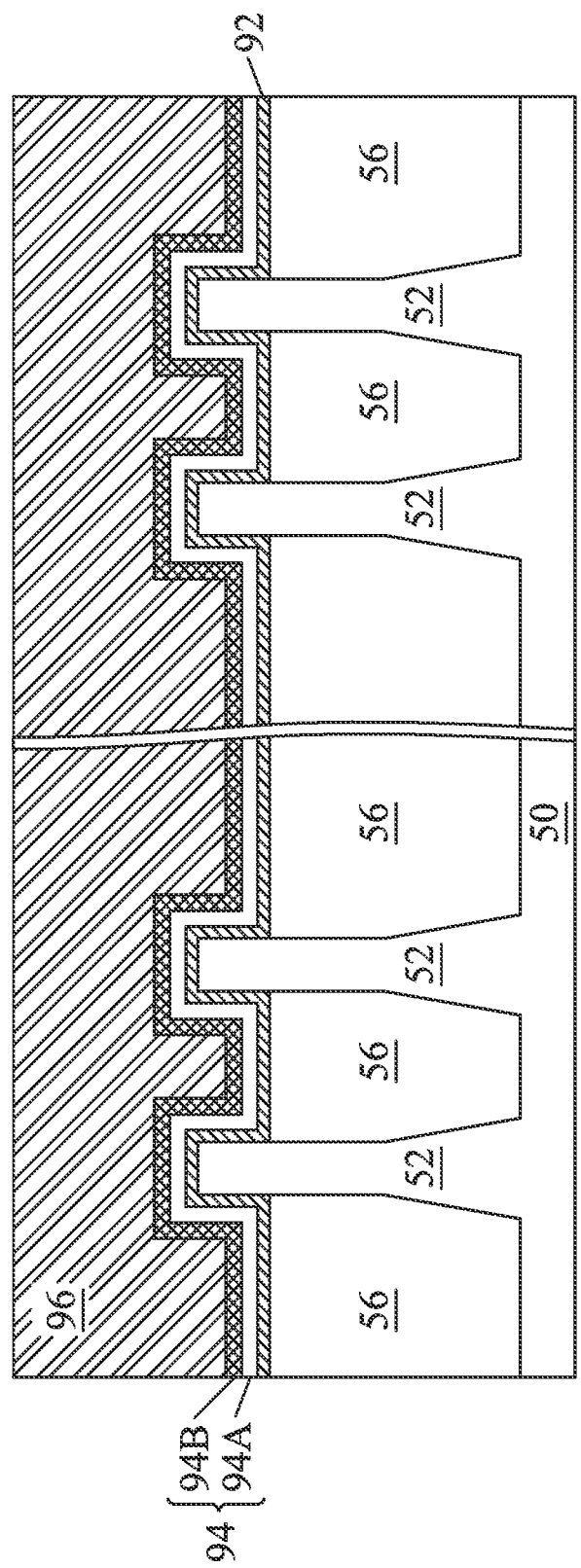
Figure 9B:
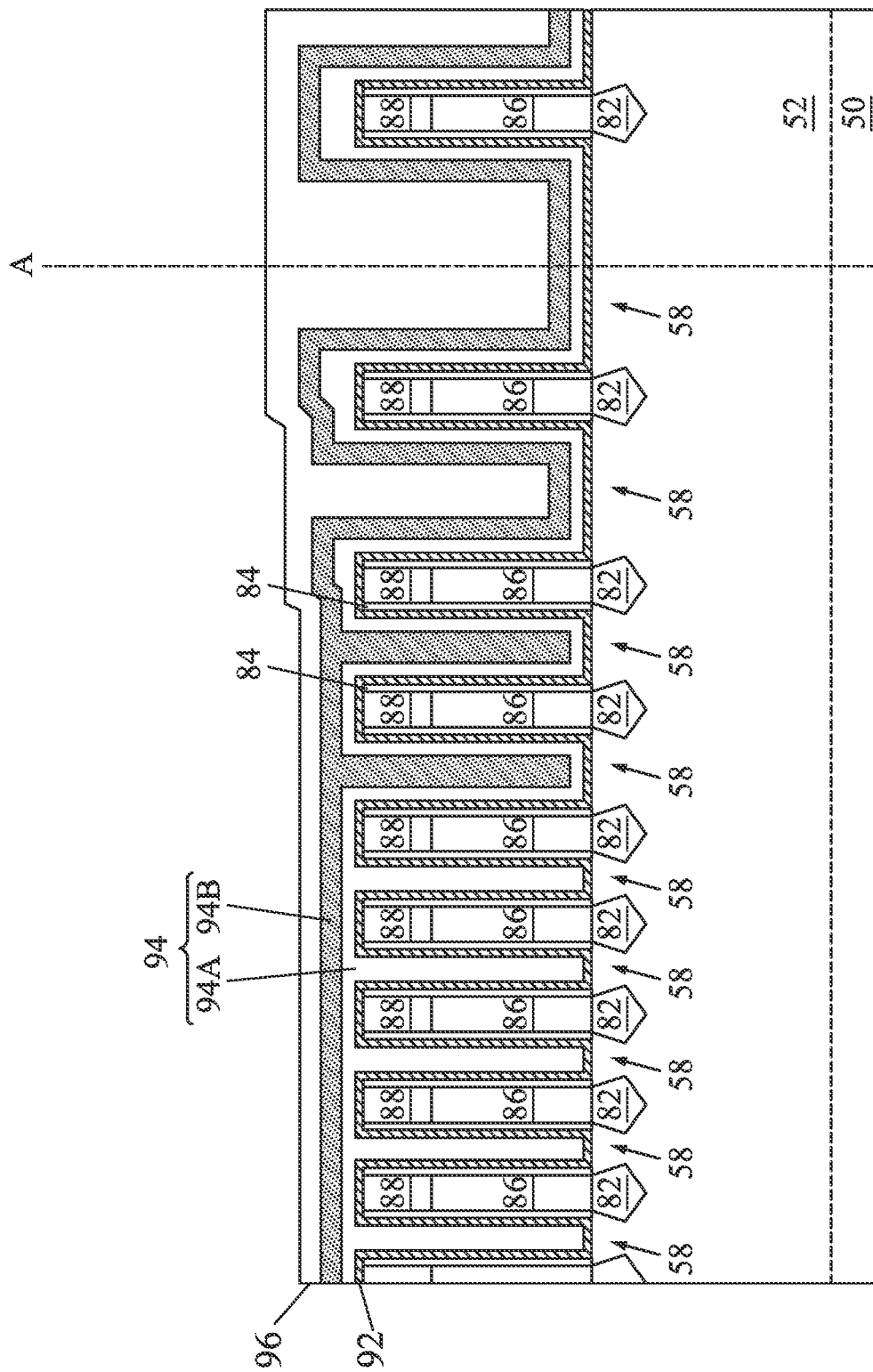

In FIGS. 9A and 9B, a gate dielectric layer 92 is formed in the recesses 90 and on the top surface of the ILD masks 88. In accordance with some embodiments, the gate dielectric layer 92 comprises silicon oxide, silicon nitride, or multilayers thereof. In some embodiments, the gate dielectric layer 92 includes a high-k dielectric material, and in these embodiments, the gate dielectric layer 92 may have a k value greater than about 7.0, and may include a metal oxide or a silicate of hafnium, aluminum, zirconium, lanthanum, manganese, barium, titanium, lead, and combinations thereof. The formation methods of the gate dielectric layer 92 may include Molecular-Beam Deposition (MBD), atomic layer deposition (ALD), PECVD, and the like. In embodiments where portions of the dummy gate dielectrics 70 remain in the recesses 90, the gate dielectric layer 92 may only be formed in the recesses 90 unoccupied by the remaining dummy gate dielectrics 70.

Further, gate electrode layers 94 are formed on the gate dielectric layer 92, filling the remaining portions of the recesses 90. The gate electrode layers 94 may be formed of conductive materials such as titanium nitride, titanium oxide, tantalum nitride, tantalum carbide, cobalt, ruthenium, aluminum, tungsten, combinations thereof, or the like, and may be formed by MBD, ALD, PECVD, or the like. The gate electrode layers 94 can include any number of liner layers (not shown), any number of work function tuning layers 94A, and a filler layer 94B. Portions of the gate dielectric layer 92 and gate electrode layers 94 in each recess 90 will be used to form replacement gates of the resulting FinFETs. The portions of the gate dielectric layer 92 and gate electrode layers 94 in each recess 90 may be collectively referred to as a "metal gate stack." The metal gate stacks may extend along sidewalls of channel regions 58 of the fins 52. As discussed above, the recesses 90 include recesses of different widths $W_1/W_2/W_3/W_4$, allowing Fin-FETs with channel regions 58 of varying lengths to be formed. The metal gate stacks thus also have differing widths.

Further, a gate mask layer 96 is formed on the gate electrode layers 94. The gate mask layer 96 may be formed of an insulating material such as silicon oxide, silicon nitride, silicon oxynitride, silicon carbonitride, a combination thereof, or the like. The gate mask layer 96 may be formed by MBD, ALD, PECVD, or the like.

During formation of the gate electrode layers 94, some of the recesses 90 (e.g., smaller recesses) may be filled before the gate mask layer 96 and all of the gate electrode layers 94 are formed. In the example shown, the recesses 90A are filled with the work function tuning layers 94A; the recesses 90B are filled with the work function tuning layers 94A and the filler layer 94B; and the recesses 90C and 90D are filled with the work function tuning layers 94A, the filler layer 94B, and the gate mask layer 96. The resulting metal gate stacks in the differently sized recesses 90 may thus comprise different materials. Filling the different sized recesses 90 with different materials allows metal gate stacks with different work functions to be formed. Because the channel regions 58 have differing lengths (and thus the recess 90 have differing widths), pattern loading occurs during deposition of the gate electrode layers 94. As such, portions of the gate electrode layers 94 over the recesses 90C and 90D are thicker than portions of the gate electrode layers 94 over the recesses 90A and 90B.

Figure 10A:
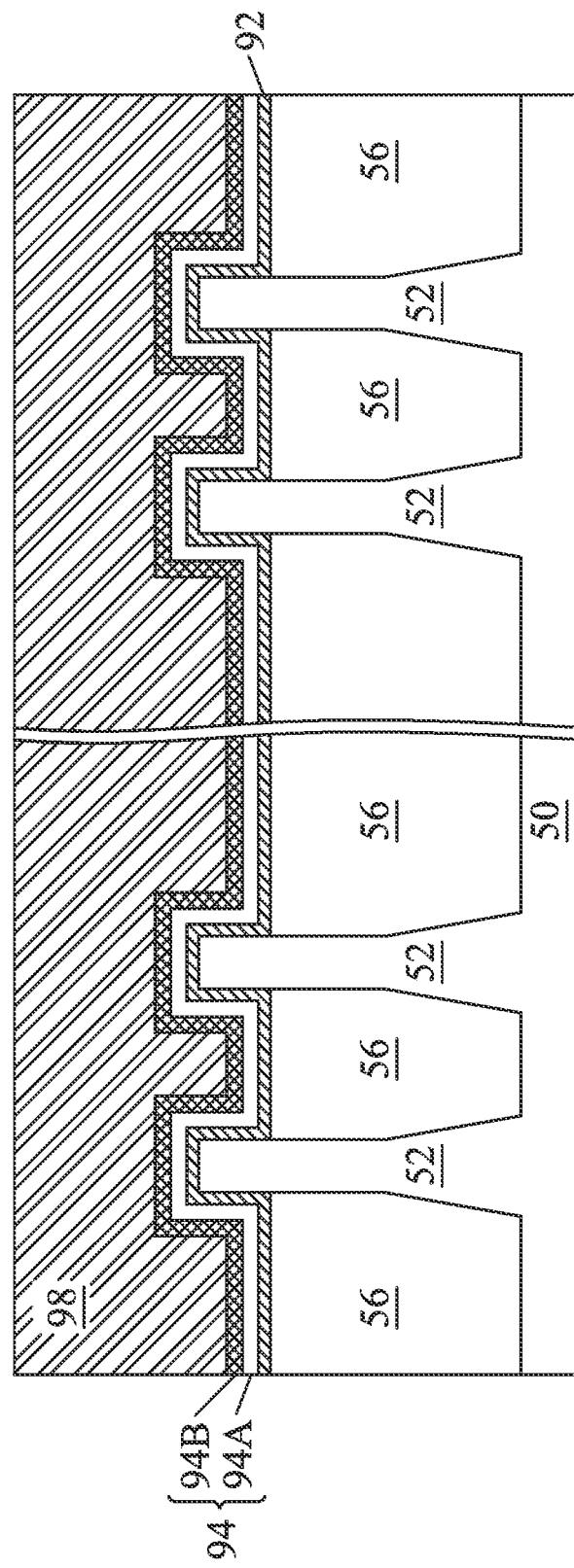
Figure 10B:
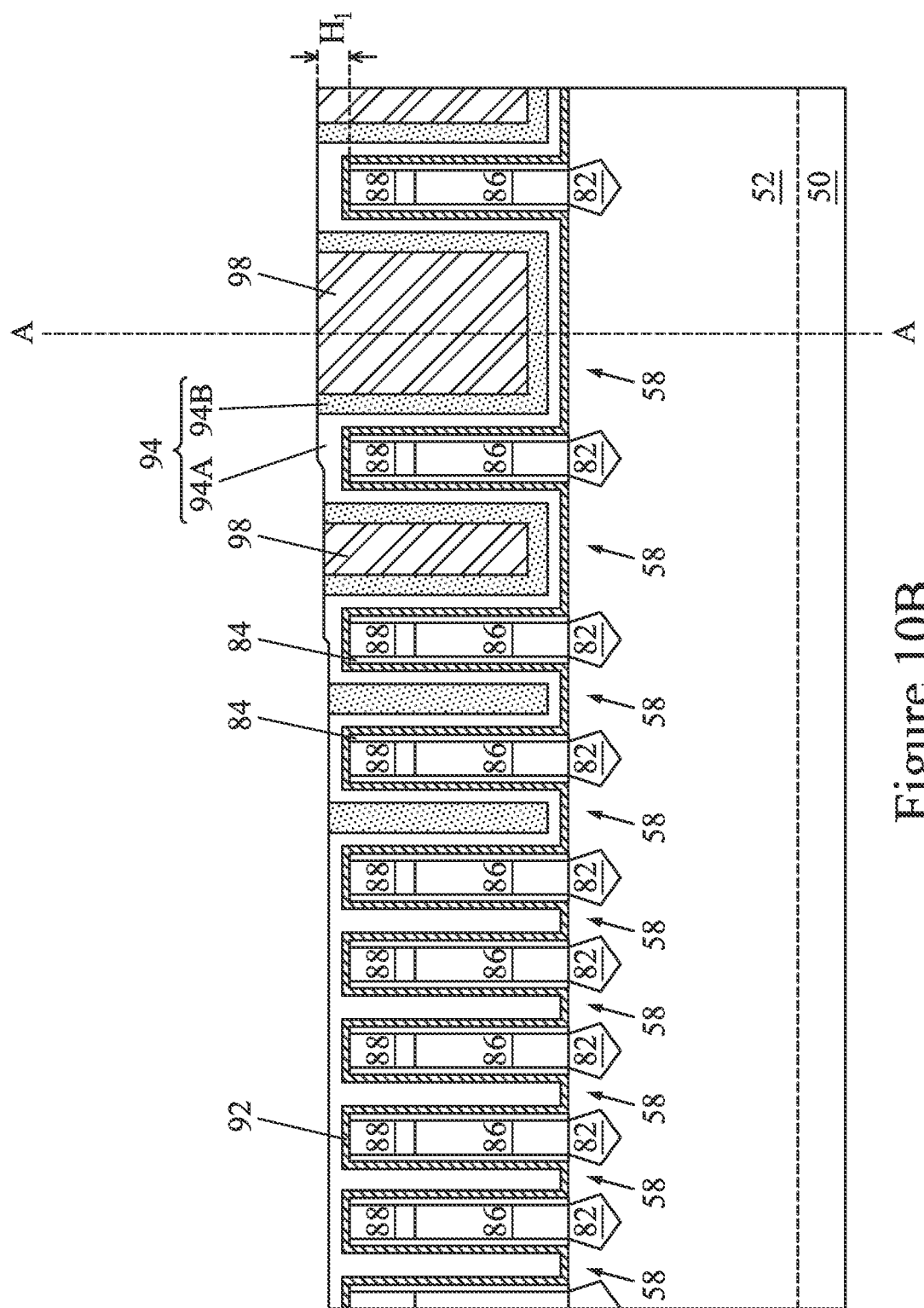

In FIGS. 10A and 10B, a planarization process is performed to expose the bottommost layers of the gate electrode layers 94, e.g., the work function tuning layers 94A. The planarization process may include performing one or more CMP processes. For example, a first CMP process may be performed to remove overlying portions of the gate mask layer 96, with the filler layer 94B acting as a CMP stop layer during the first CMP process. A second CMP process may then be performed to remove the filler layer 94B, with the work function tuning layers 94A acting as a CMP stop layer during the second CMP process. The remaining portions of the gate mask layer 96 over each channel region 58 are referred to as gate masks 98. The gate masks 98 may help control the second CMP process, e.g., by acting as erosion control layers and/or pattern loading control layers, slowing the planarization rate of the second CMP process, and thus controlling the amount of work function tuning layers 94A that remains. The gate masks 98 will also protect longer channel regions 58 during subsequent processing, and can help reduce pattern loading effects for longer channel regions 58 during middle end of line (MEOL) processing. As noted above, pattern loading occurs during deposition of the gate electrode layers 94. The pattern loading causes the planarization process to have a non-uniform profile. As a result, the remaining portions of the planarized layers above the ILD masks 88 may have a large height variation $H_1$. For example, the height variation $H_1$ can be in the range of about 20 Å to about 100 Å. In this embodiment, the top surfaces of the gate masks 98 extend above the top surfaces of the ILD masks 88. In another embodiment (discussed below), the top surfaces of the ILD masks 88 extend above the top surfaces of the gate masks 98.

Figure 11A:
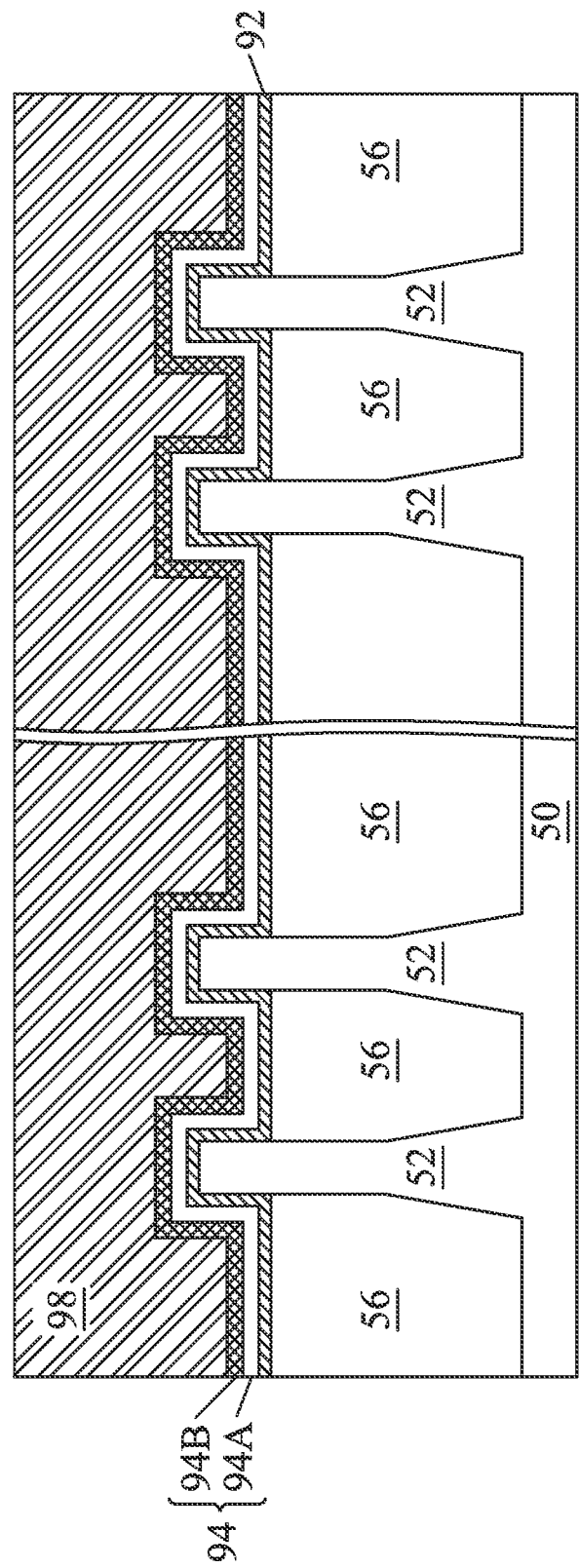
Figure 11B:
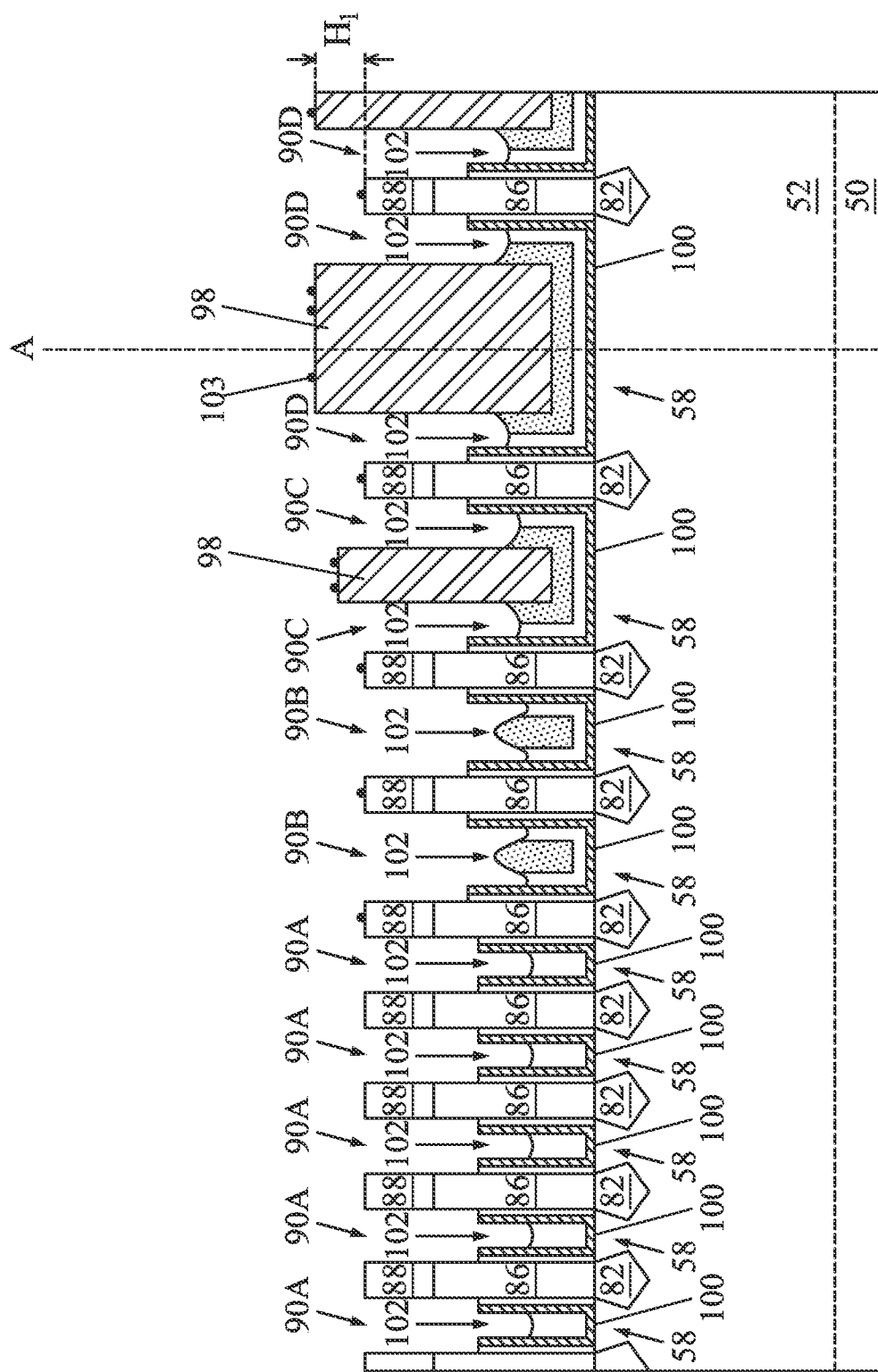

In FIGS. 11A and 11B, a recessing process is performed to etch-back the gate dielectric layer 92 and gate electrode layers 94 thereby reforming the recesses 90A/90B/90C/90D. The remaining portions of the gate dielectric layer 92 over each channel region 58 are referred to as gate dielectrics 100, and the remaining portions of the gate electrode layers 94 over each channel region 58 are referred to as gate electrodes 102. The recessing process may include performing one or more etch-back process(es). Each etch-back process may be accomplished by any acceptable etch process, such as a reactive ion etch (RIE), neutral beam etch (NBE), the like, or a combination thereof. The etch may be anisotropic. The etch-back process(es) are selective to the materials of the gate dielectrics 100 and gate electrodes 102, such that the gate masks 98 are not significantly recessed by the etch-back process(es). However, the etch-back process(es) may still increase the surface roughness of the gate masks 98, even if substantially no recessing occurs, and may also leave behind some byproducts 103. As discussed further below, an increased surface roughness may decrease the CMP removal rate of the gate masks 98, increasing selectivity during CMP. As such, in further processing, the gate masks 98 are planarized by performing additional etch-back process(es), instead of by only performing CMP processes, allowing for a more uniform removal rate.

The formation of the gate dielectrics 100 in the region 50N and the region 50P (see FIGS. 2 and 3) may occur simultaneously such that the gate dielectrics 100 in each region are formed from the same materials, and the formation of the gate electrodes 102 may occur simultaneously such that the gate electrodes 102 in each region are formed from the same materials. In some embodiments, the gate dielectrics 100 in each region may be formed by distinct processes, such that the gate dielectrics 100 may be different materials, and/or the gate electrodes 102 in each region may be formed by distinct processes, such that the gate electrodes 102 may be different materials. For example, the process described with respect to FIGS. 9A through 11B may be performed once in the region 50N while the region 50P is masked, and then may be performed again in the region 50P while the region 50N is masked. Channel regions 58 of differing lengths may be formed in both regions 50N and 50P. Various masking steps may be used to mask and expose appropriate regions when using distinct processes.

Figure 12A:
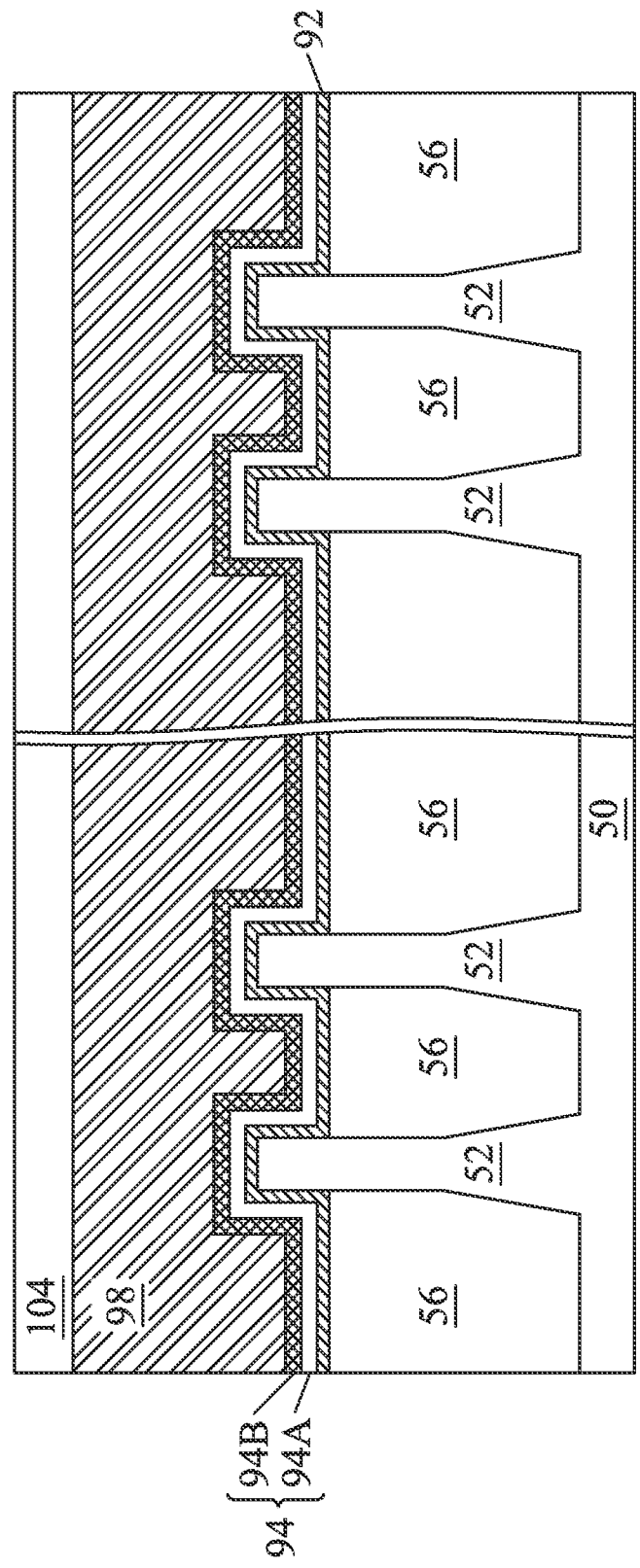
Figure 12B:
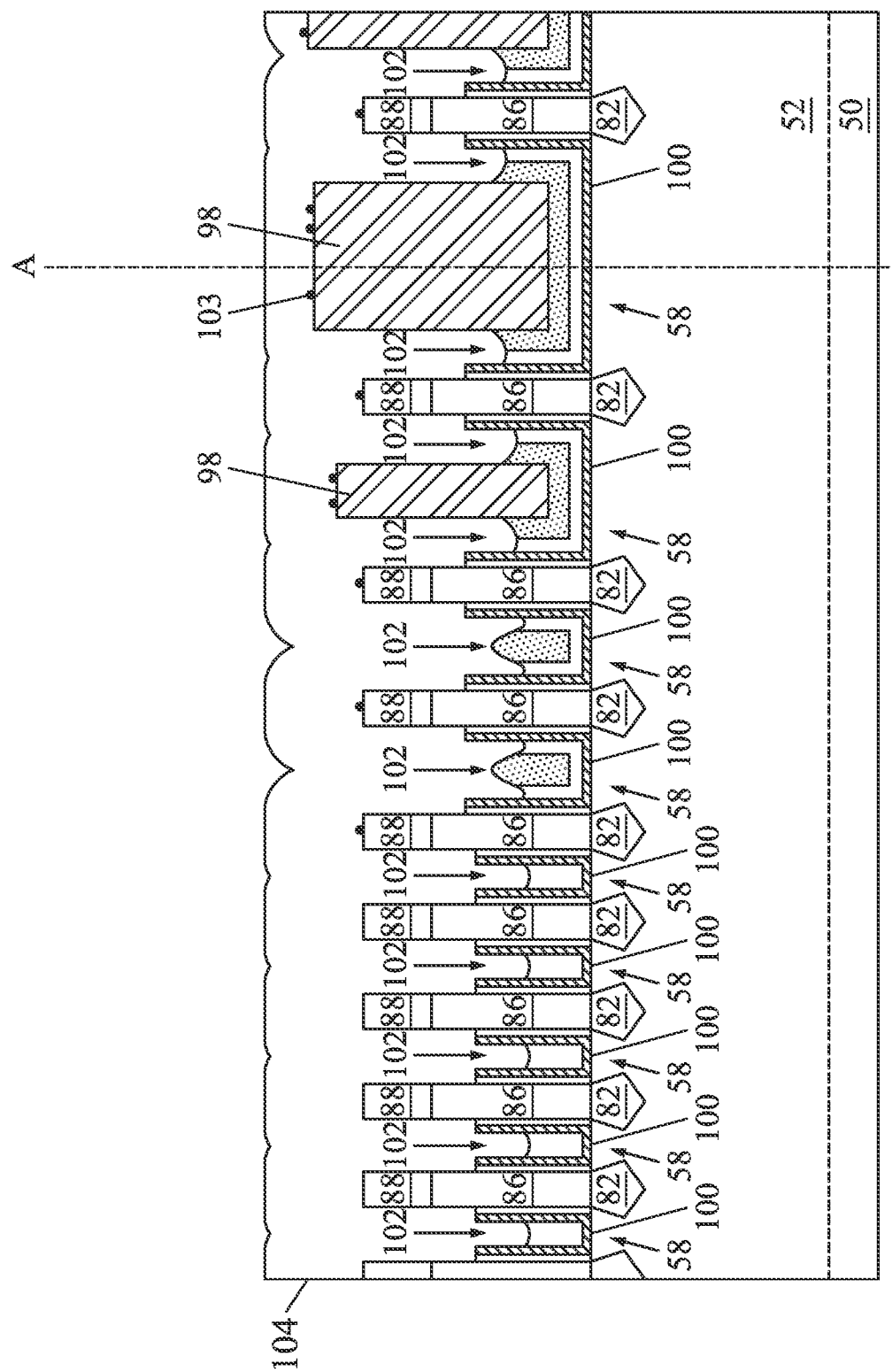

In FIGS. 12A and 12B, a first filling layer 104 is deposited over the illustrated intermediate structure. The first filling layer 104 is selective to an etch-back processes that will be performed to planarize the gate masks 98, and will be used as an etch stop layer in subsequent processing steps. The first filling layer 104 may be formed of a non-conductive material such as silicon nitride, undoped polysilicon, undoped amorphous silicon, silicon oxycarbonitride, zirconium oxide, hafnium oxide, or the like, and may be formed by a deposition process such as CVD, ALD, or the like. In some embodiments, the first filling layer 104 is a layer of silicon. The deposition of the first filling layer 104 is conformal, such that the topography of the first filling layer 104 conforms to the topography of the underlying features.

Figure 13A:
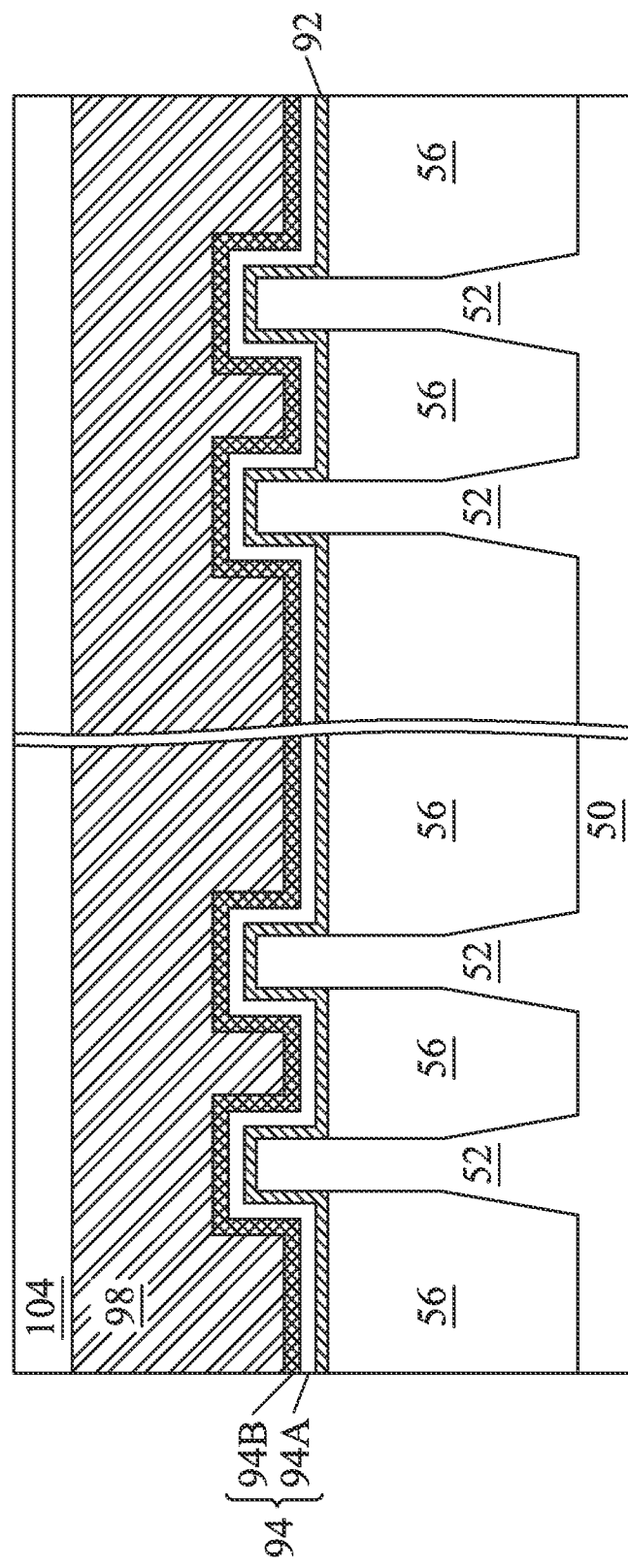
Figure 13B:
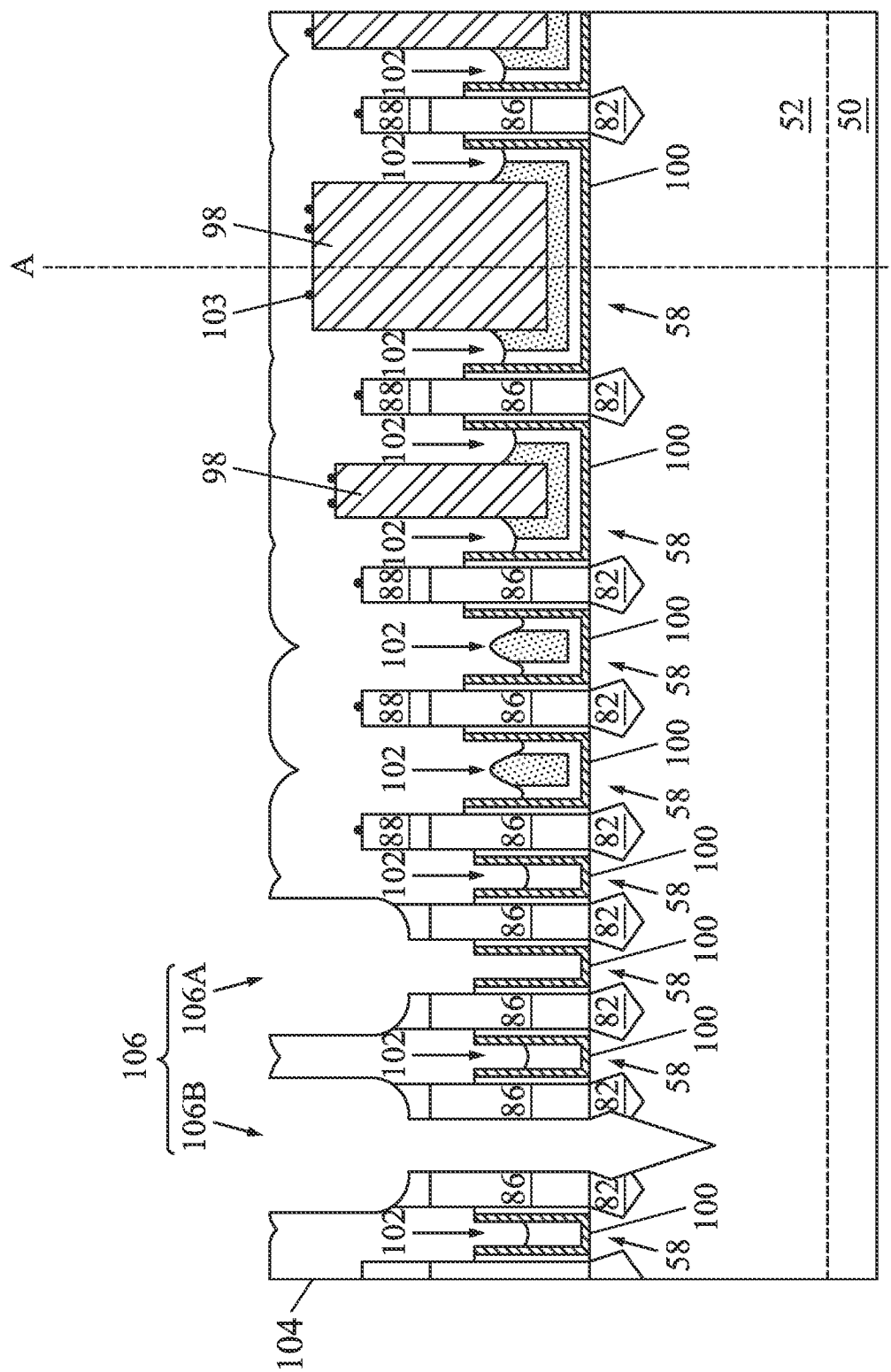

In FIGS. 13A and 13B, the first filling layer 104 is patterned with openings 106, including openings 106A and 106B. The openings 106 may be patterned using acceptable photolithography and etching techniques. The openings 106A and 106B may be formed by different photolithography processes, such as with different photolithography masks. The etching processes used for forming the openings 106 are continued to remove features underlying the openings 106. For example, the etching process for the openings 106A may be continued to remove underlying portions of the gate electrodes 102 (and optionally, the gate dielectrics 100), thereby forming cuts for the replacement gates of the resulting FinFETs. Likewise, the etching process for the openings 106B may be continued to remove underlying portions of the gate dielectrics 100 and gate electrodes 102, and portions of the fins 52 and epitaxial source/drain regions 82, thereby forming cuts isolating the fins of adjacent FinFETs. During formation of the openings 106, some etching of the ILD masks 88 may also occur, but the first ILD 86 remains substantially unetched.

Figure 14A:
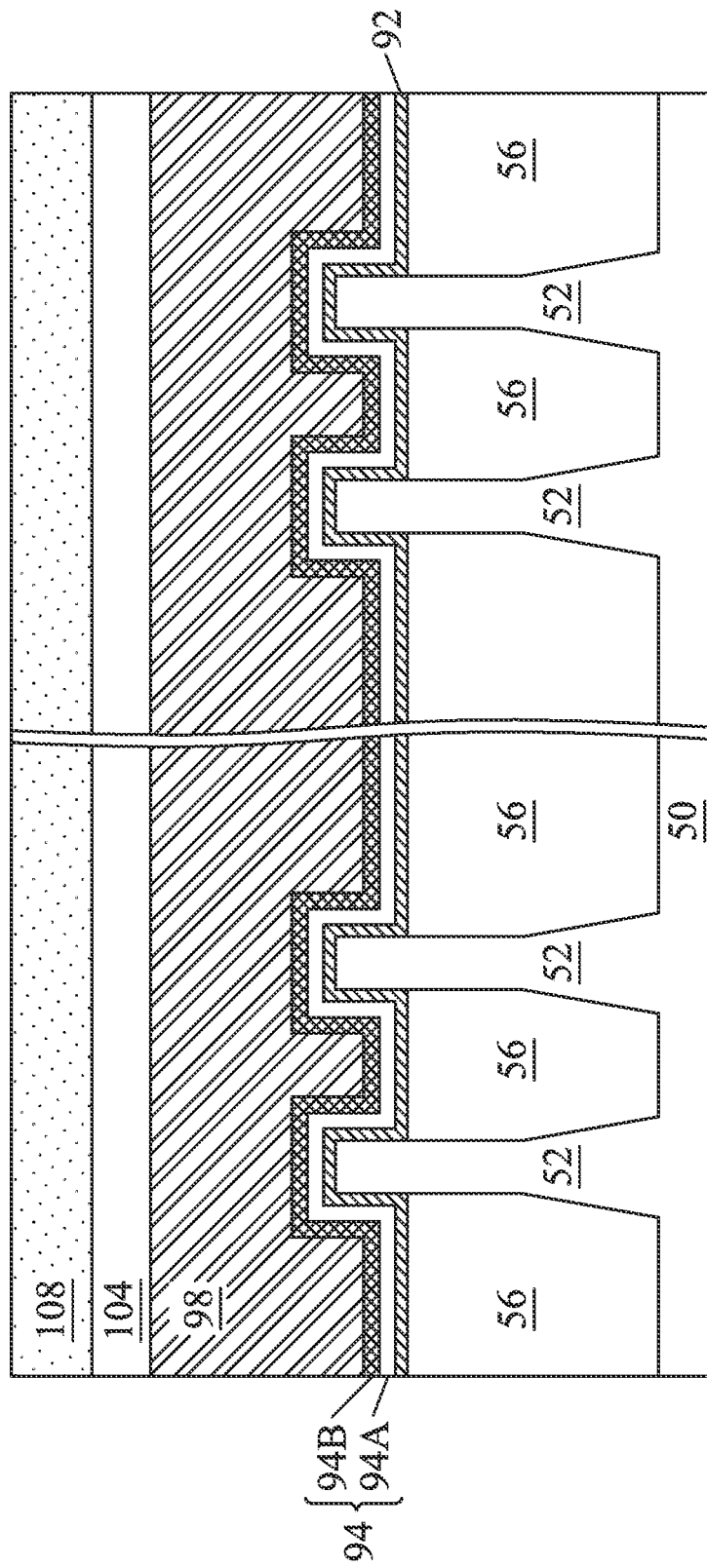
Figure 14B:
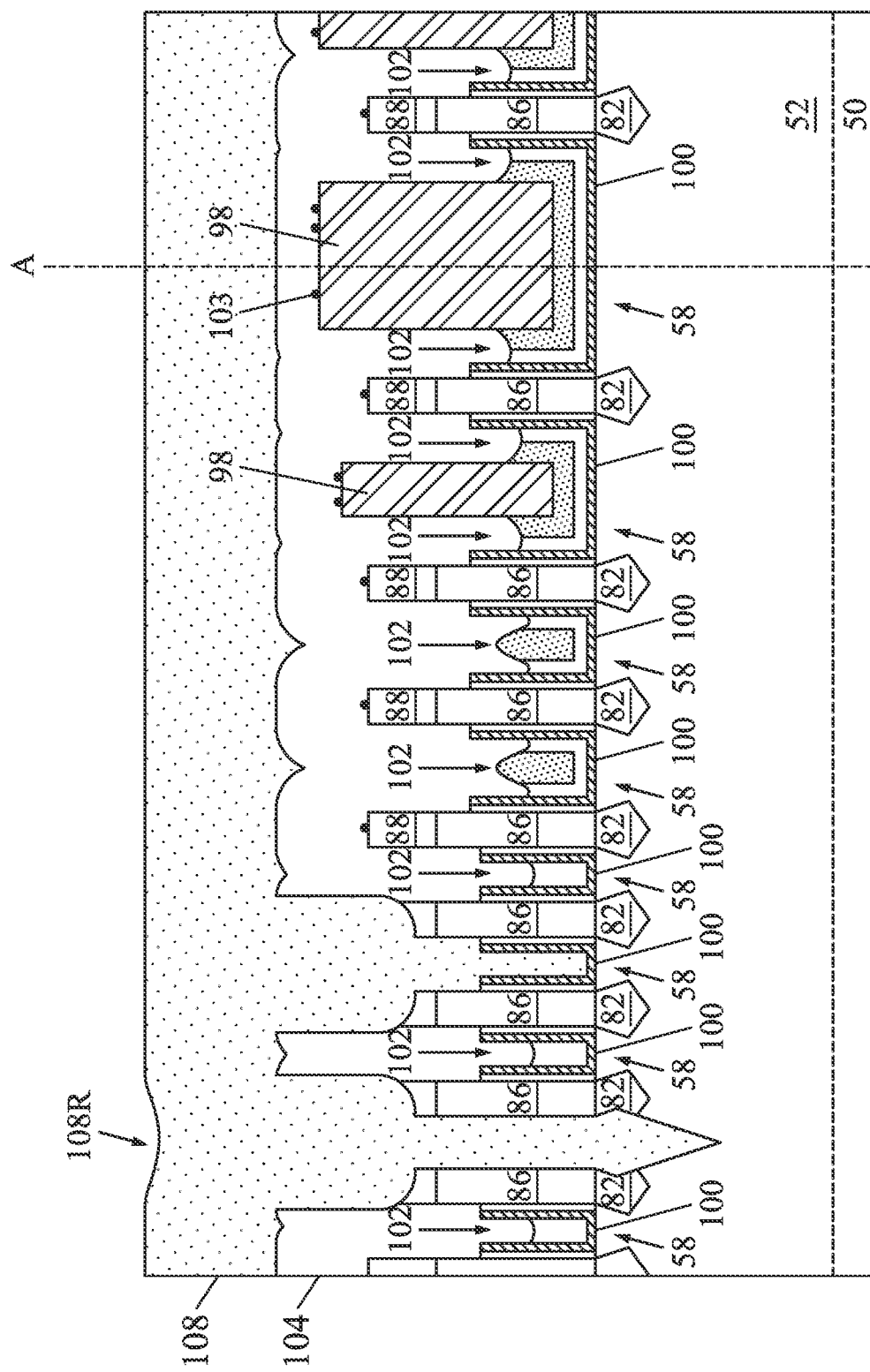

In FIGS. 14A and 14B, a second filling layer 108 is deposited over the first filling layer 104 and in the openings 106. The second filling layer 108 is selective to an etch-back processes that will be performed to planarize the first filling layer 104, gate masks 98, and ILD masks 88. The second filling layer 108 will be used as the isolation material after the cuts for the replacement gates and between adjacent fins are formed. The second filling layer 108 may be formed of a dielectric material such as silicon oxide, silicon nitride, a combination thereof, or the like, and may be formed by a deposition process such as CVD, ALD, or the like. In some embodiments, the second filling layer 108 is a layer of silicon nitride. The deposition of the second filling layer 108 is conformal, such that the topography of the second filling layer 108 conforms to the topography of the underlying features. As such, the top surface of the second filling layer 108 may have recesses 108R over features with deep recesses, such as over the openings 106B.

Figure 15A:
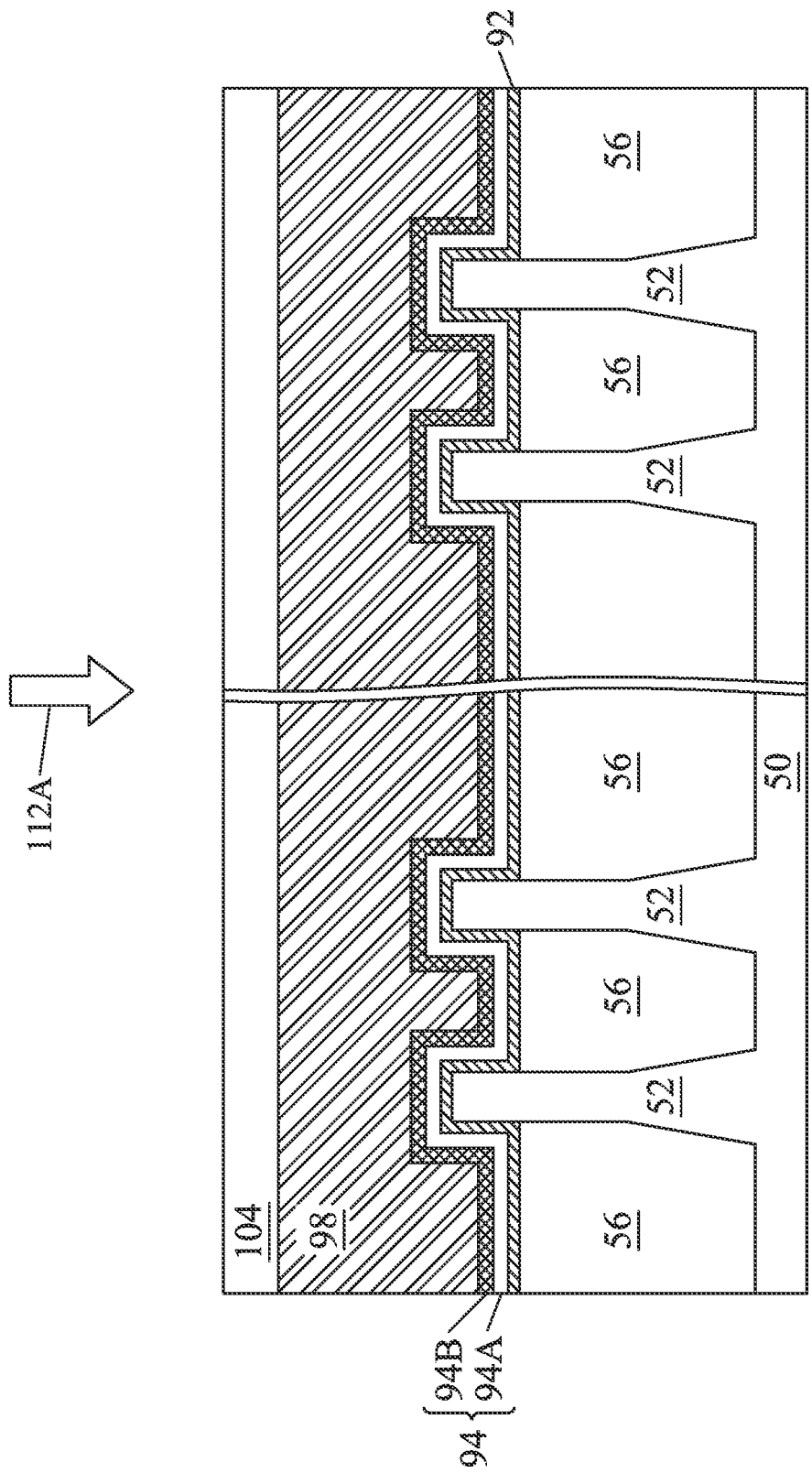
Figure 15B:
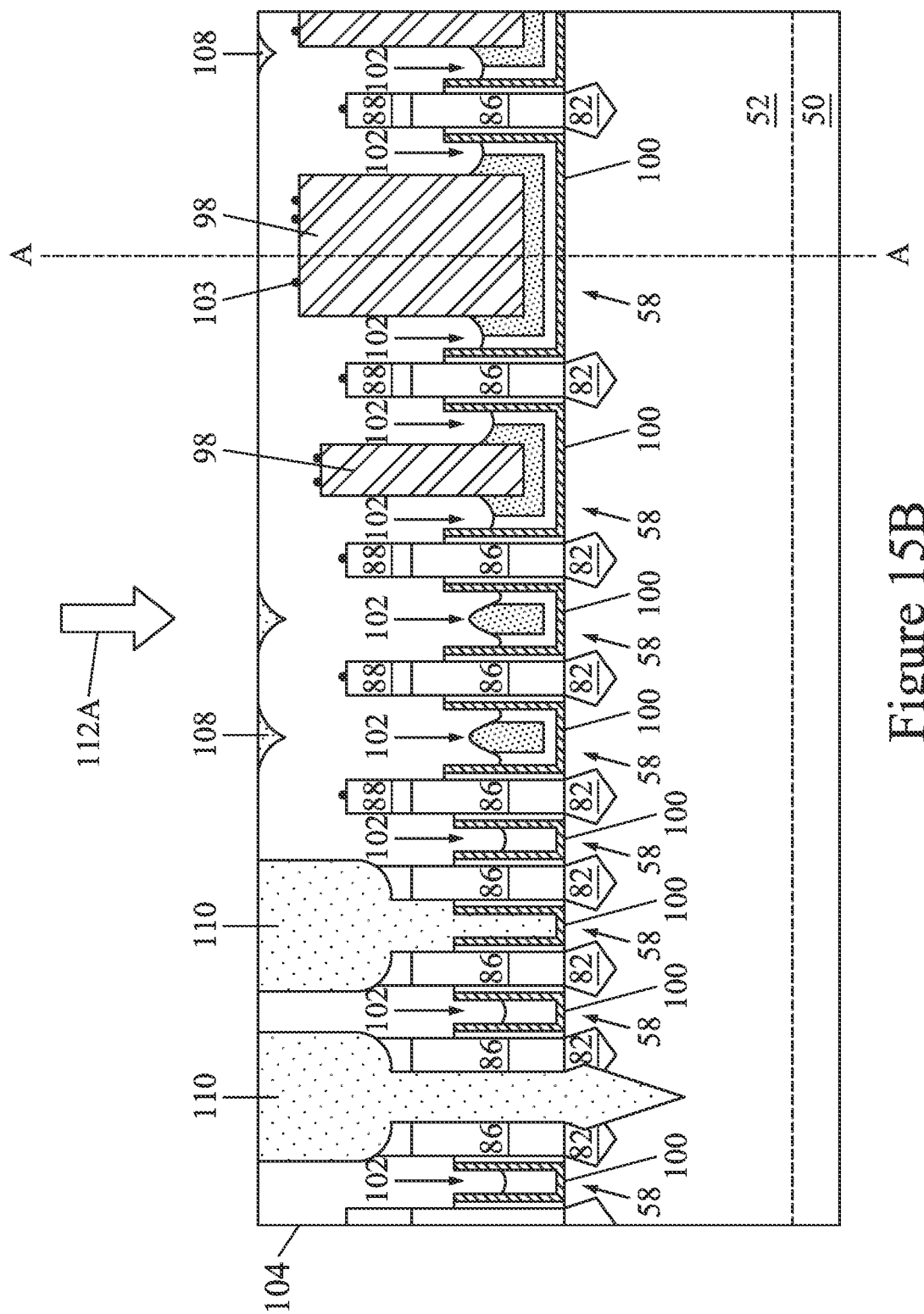

In FIGS. 15A and 15B, a first planarization process 112A is performed to remove excess portions of the second filling layer 108, which excess portions are over the top surface of the first filling layer 104. The remaining portions of the second filling layer 108 in the openings 106 are referred to as isolation features 110. In some embodiments, the first planarization process 112A is a CMP process. Portions of the first filling layer 104 act as a CMP stop layer for the first planarization process 112A, such that most of the first filling layer 104 remains after the first planarization process 112A. Due to the conformal topographies of the first filling layer 104 and second filling layer 108, some residual portions of the second filling layer 108 may remain in recesses in the top surface of the first filling layer 104. In other words, the majority of the topmost surface of the structure comprises the first filling layer 104, but some portions of the topmost surface comprise the remainder of the second filling layer 108 and isolation features 110. The first planarization process 112A thus acts as a planarization reset step, where unevenness in the topography of the illustrated intermediate structure is substantially reduced.

Figure 16A:
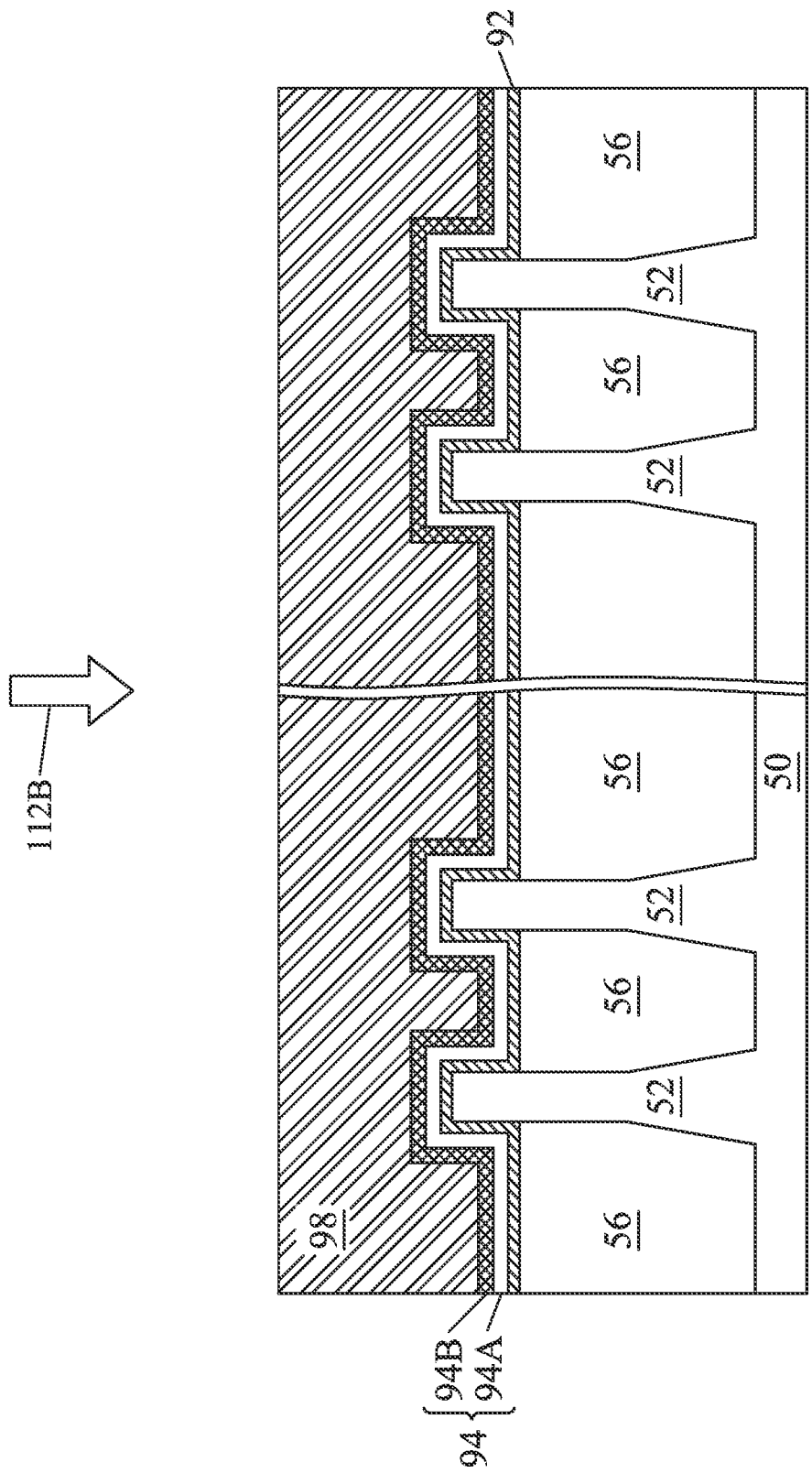
Figure 16B:
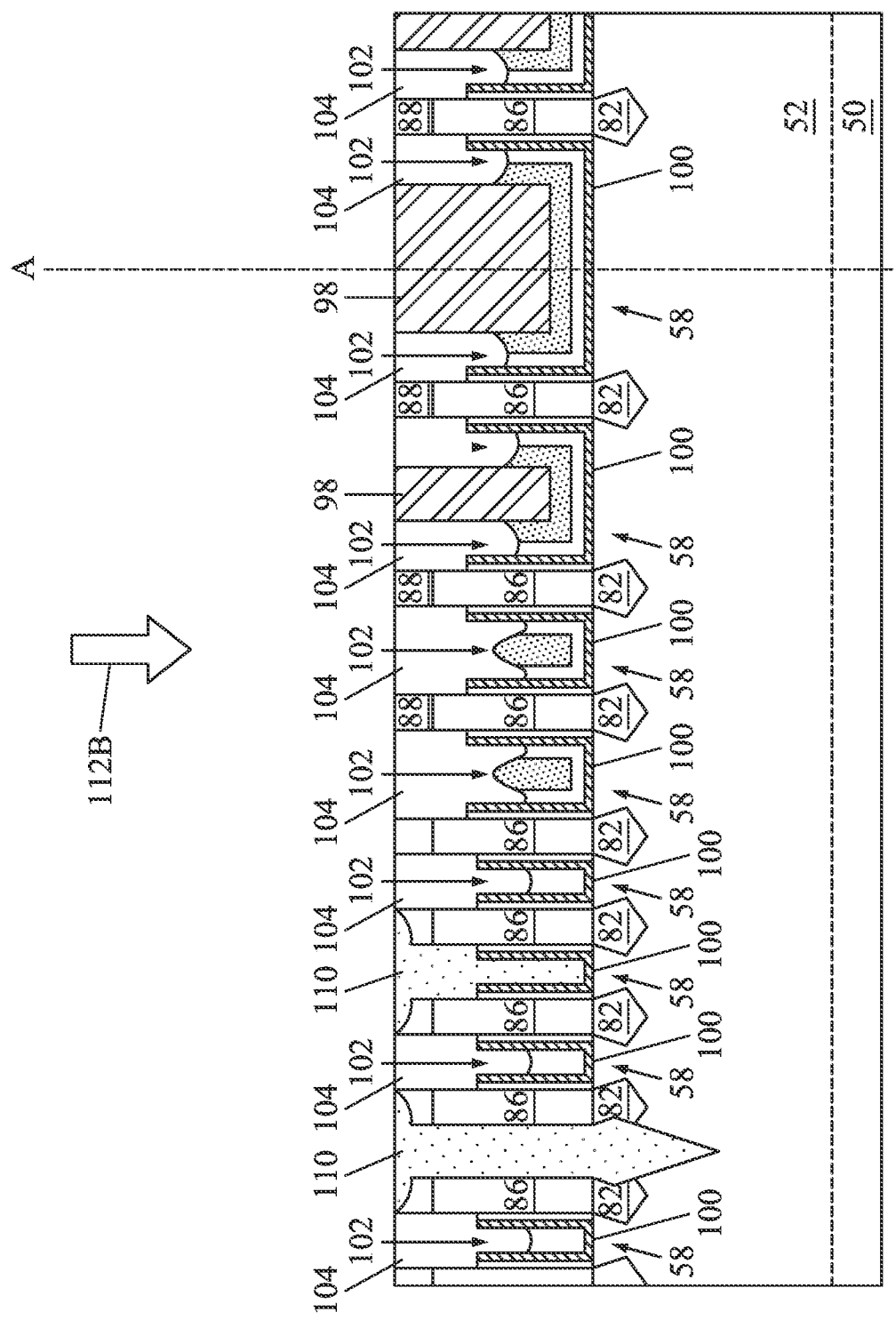

In FIGS. 16A and 16B, a second planarization process 112B is performed to remove excess portions of the first filling layer 104 and isolation features 110, which excess portions are over the top surface of the ILD masks 88. The second planarization process 112B may also remove portions of the ILD masks 88 and gate masks 98, and the byproducts 103. The second planarization process 112B is different from the first planarization process 112A, and the selectivity of the second planarization process 112B is less than the selectivity of the first planarization process 112A. In some embodiments, the second planarization process 112B is an etch-back process. The etch-back process is a non-selective etch that etches the materials of the isolation features 110, first filling layer 104, gate masks 98, and ILD masks 88 at the same rate. As noted above, in some embodiments, the first filling layer 104 is a layer of silicon, and the isolation features 110, gate masks 98, and ILD masks 88 are layers of silicon nitride. In such embodiments, the etch-back process etches silicon and silicon nitride at substantially the same rate, e.g., the etching rate ratio of silicon nitride to silicon for the etch-back process is in the range of about 0.9:1 to about 1.5:1, such as about 1.0:1.

As an example, the etch-back process can be a dry etch. During the dry etch, a gas source including one or more precursor gases and an inert gas is provided to an etching chamber. For example, the gas source can include a first precursor gas (e.g., $NF_3$), a second precursor gas (e.g., $H_2$), and an inert gas (e.g., Ar), with the first precursor gas and the second precursor gas being provided at a ratio in the range of about 0.5:1 to about 1.125:1. The etching chamber may be an oxygen-free environment. A plasma generator then generates RF power that produces a plasma sheath in the etching chamber from the gas source. The plasma generator can be e.g., a transformer-coupled plasma generator, inductively coupled plasma system, magnetically enhanced reactive ion etching system, electron cyclotron resonance system, a remote plasma generator, or the like. For example, the plasma generator can generate RF power in the range of about 200 W to about 1000 W, such as about 450 W. The dry etch can be performed at a low pressure and temperature, such as a pressure in the range of about 200 mT to about 2500 mT, such as about 400 mT, and such as a temperature in the range of about 15° C. to about 85° C., such as about 50° C. The dry etch may be performed in multiple cycles, such as up to about 5 cycles. For example, each cycle of the dry etch may be performed for a duration in the range of about 10 seconds to about 60 seconds, such as about 30 seconds.

After the second planarization process 112B, top surfaces of the isolation features 110, first filling layer 104, gate masks 98, and ILD masks 88 are planar. Planarizing the isolation features 110, first filling layer 104, gate masks 98, and ILD masks 88 with a non-selective etch-back process instead of a CMP allows loading effects during planarization to be reduced. Further, planarizing the gate masks 98 with an etch-back process instead of a CMP allows the materials of the isolation features 110, first filling layer 104, gate masks 98, and ILD masks 88 to be removed at substantially the same rate, notwithstanding the surface roughness of the gate masks 98. Because the second planarization process 112B (e.g., the etch-back) is performed after the first planarization process 112A (e.g., the planarization reset), the planar topography resulting from the first planarization process 112A may be transferred to the underlying features by the second planarization process 112B. The planar topography resulting from the first planarization process 112A may thus be maintained, particularly when an etch-back process on its own would preserve any unevenness in the topography.

Figure 17A:
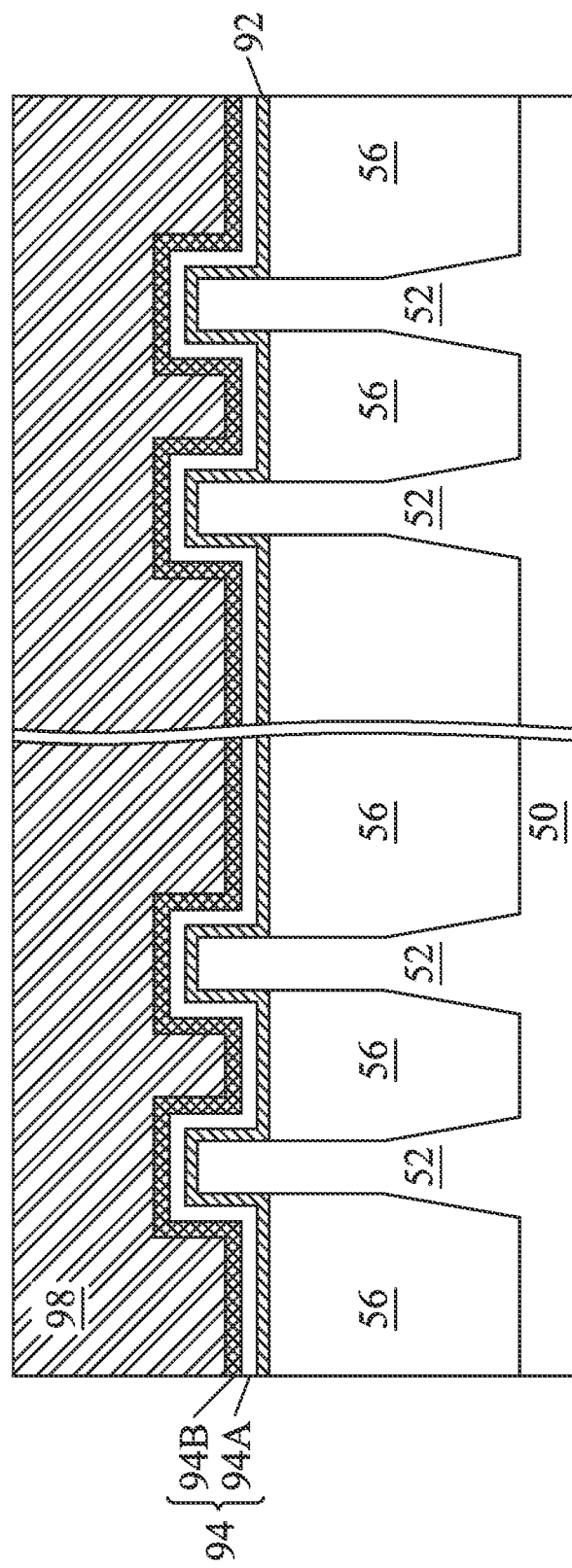
Figure 17B:
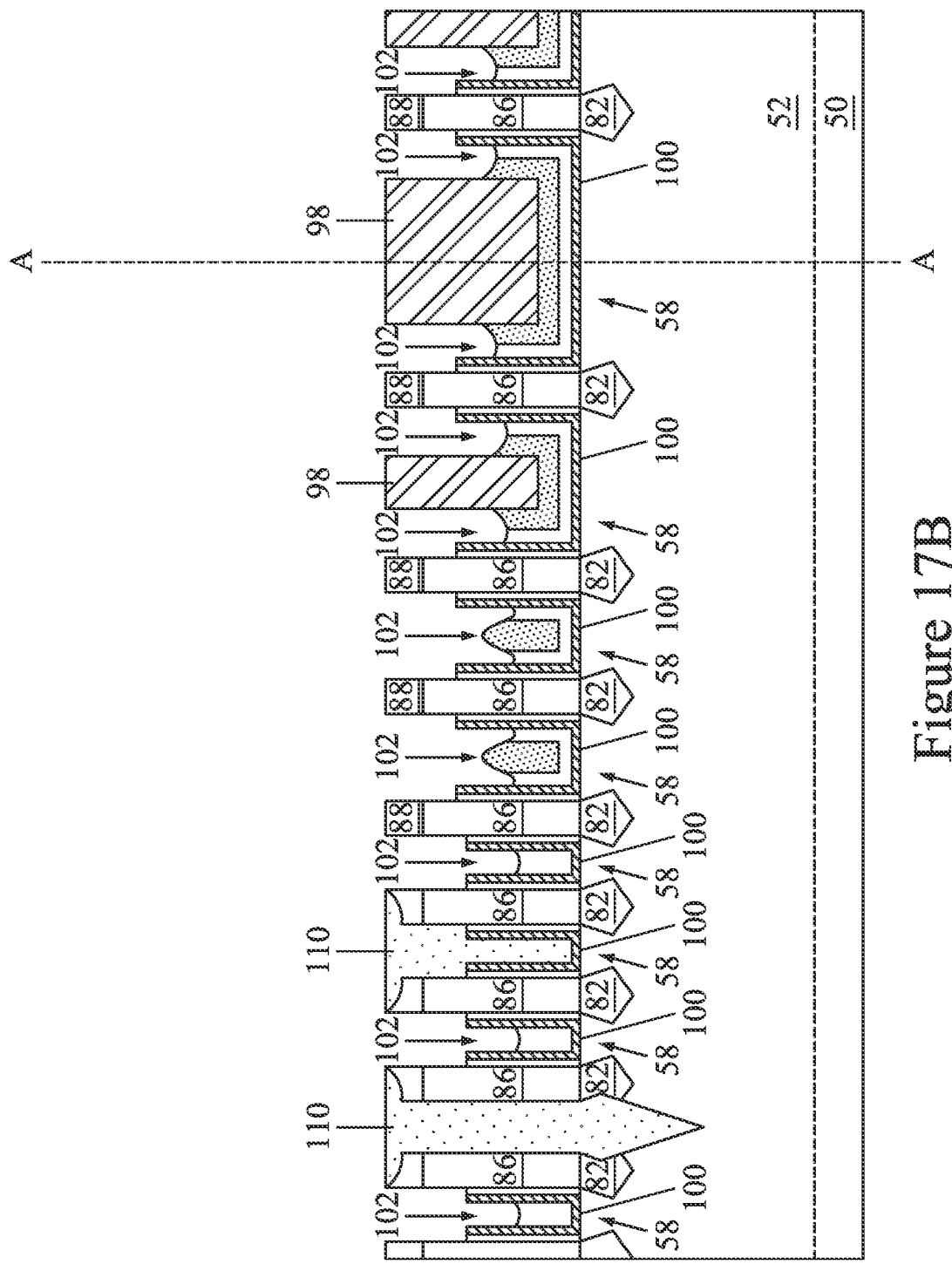

In FIGS. 17A and 17B, the remaining portions of the first filling layer 104 are removed. The remaining portions of the first filling layer 104 may be removed by, e.g., an acceptable etching process that is selective to the material of the first filling layer 104, and that does not remove the material of the isolation features 110, gate masks 98, or ILD masks 88.

Figure 18A:
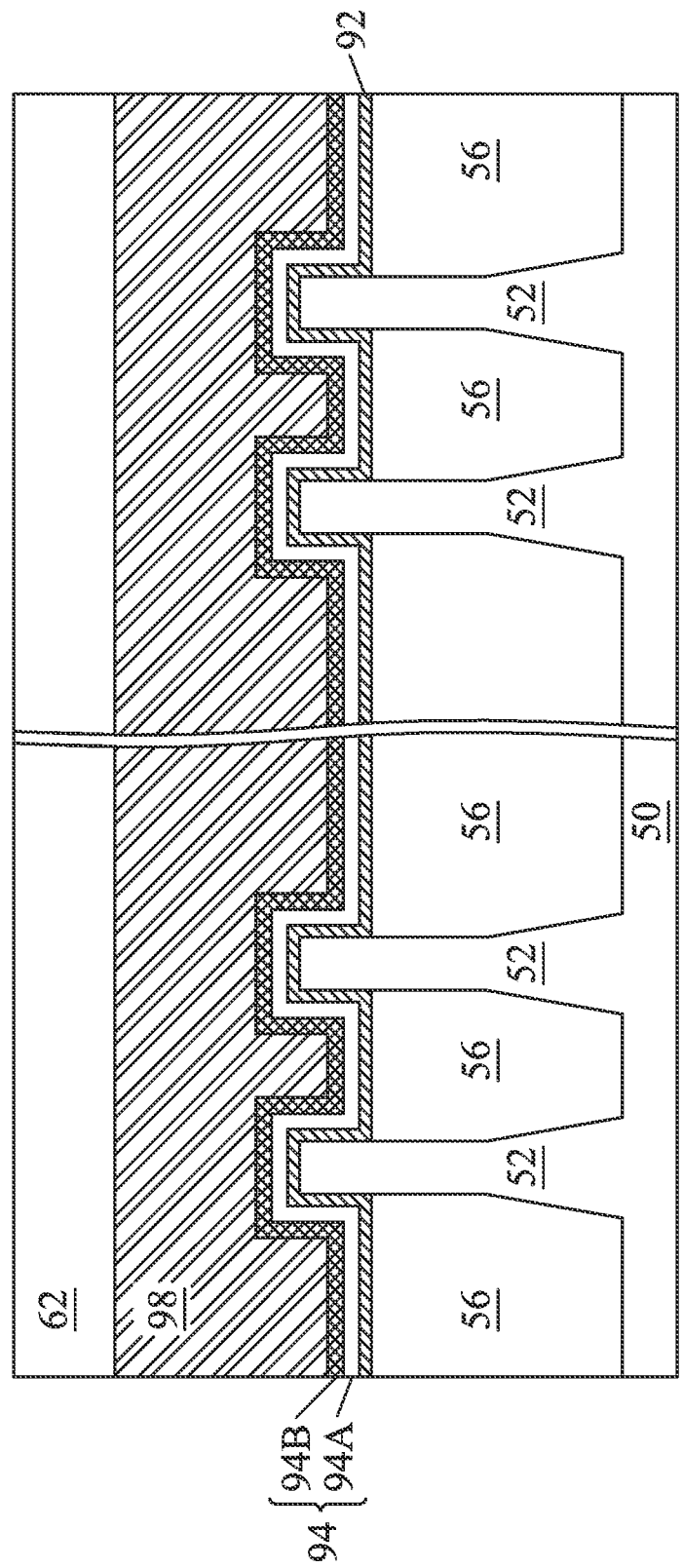
Figure 18B:
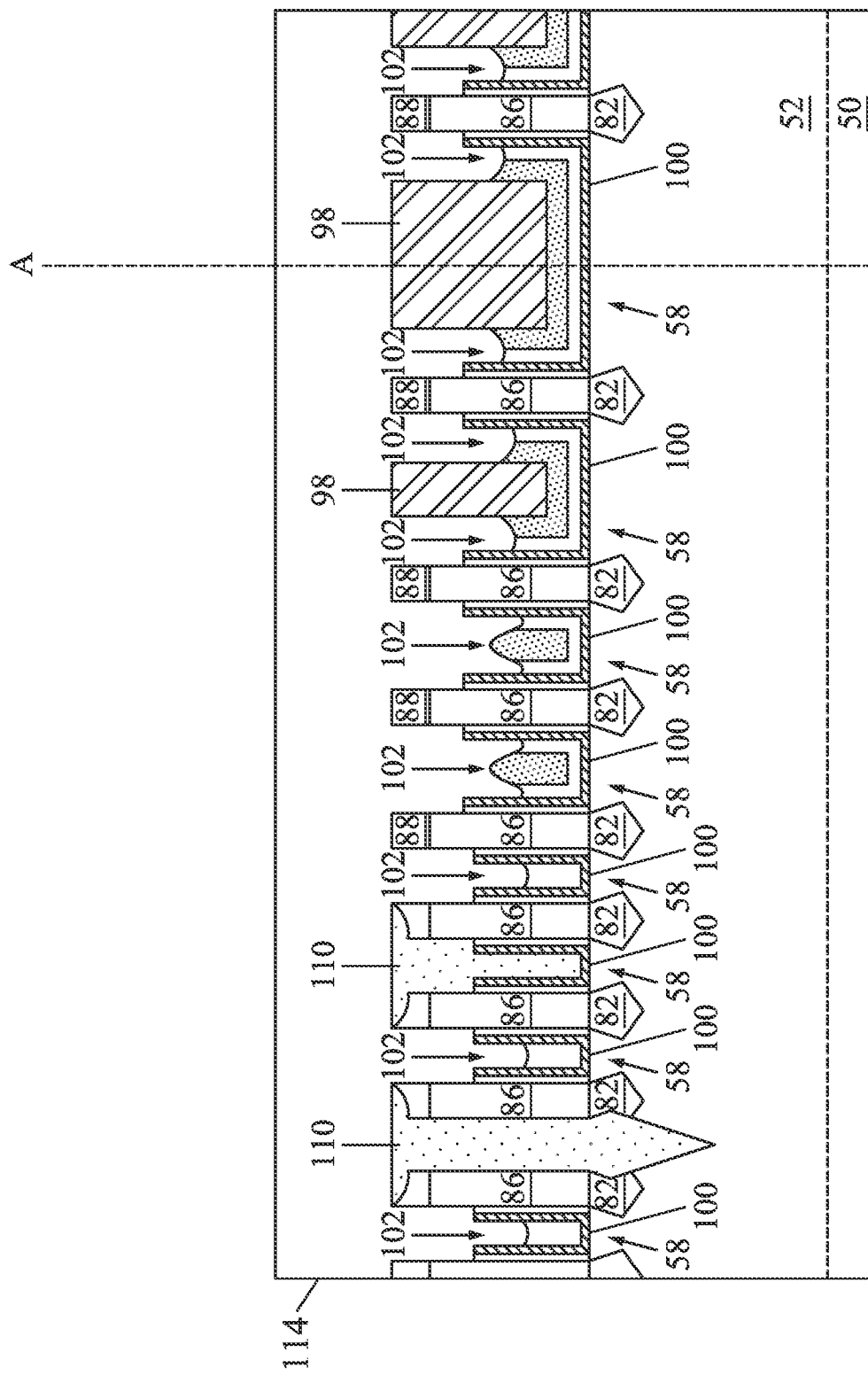

In FIGS. 18A and 18B, a gate mask layer 114 is deposited over the illustrated intermediate structure. The gate mask layer 114 may include one or more layers of dielectric material, such as silicon nitride, silicon oxynitride, or the like. The gate mask layer 114 is formed of a material that has a high etching selectivity with the first ILD 86, relative a same etch process, which can reduce the chances of shorting the epitaxial source/drain regions 82 and gate electrodes 102 during a subsequent gate contact or source/drain contact formation process. In some embodiments, the gate mask layer 114 is a layer of silicon nitride. The gate mask layer 114 may be formed by a deposition process such as CVD, ALD, or the like.

Figure 19A:
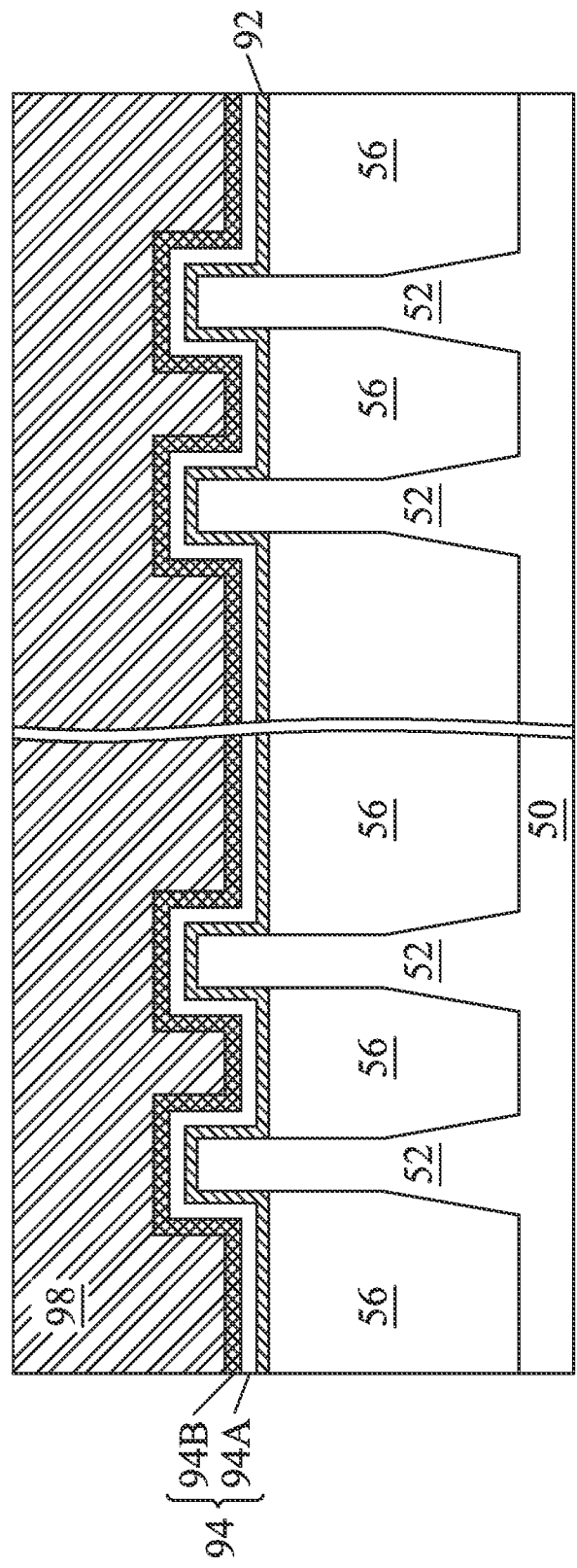
Figure 19B:
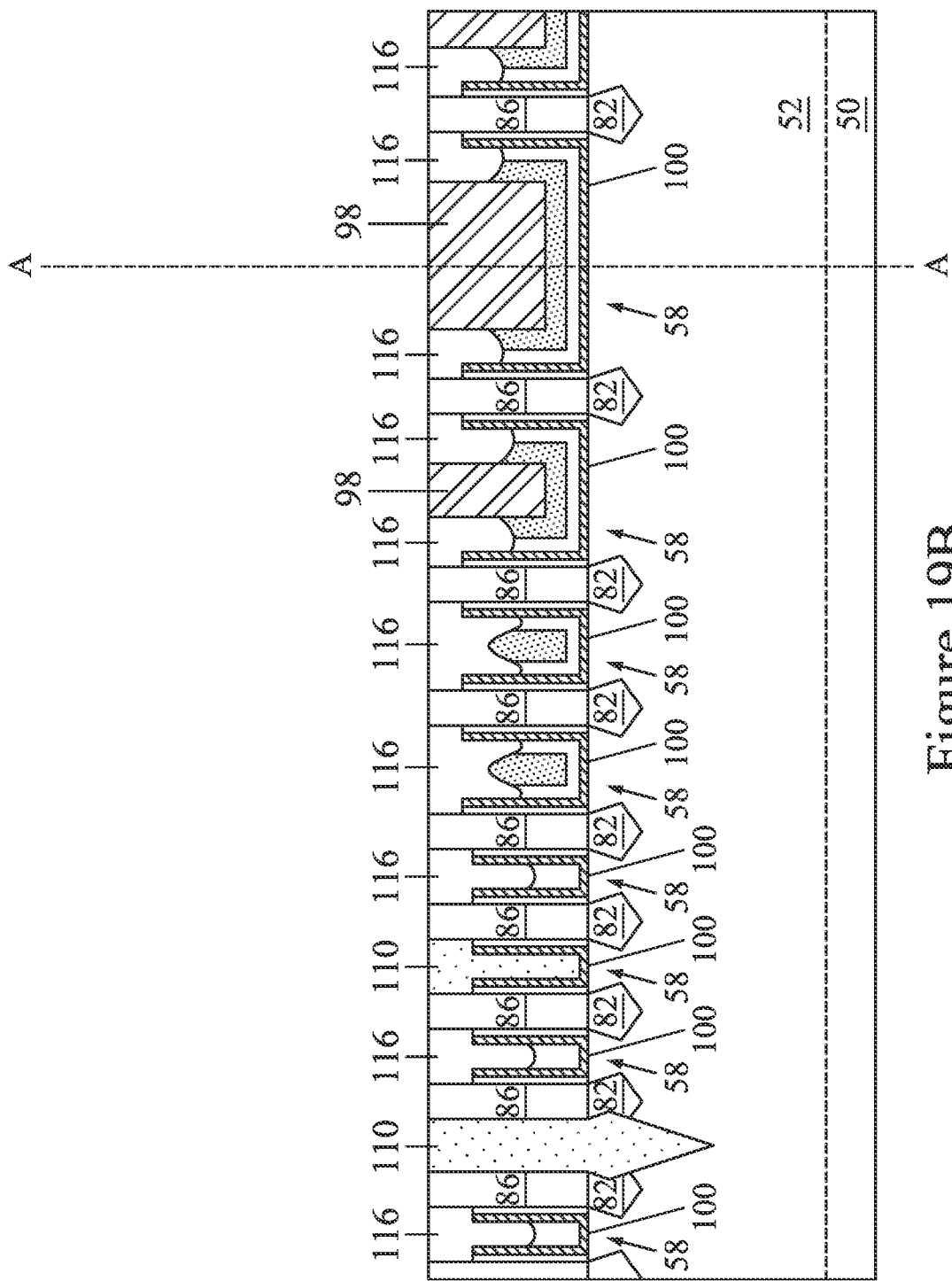

In FIGS. 19A and 19B, a planarization process is performed to remove excess portions of the gate mask layer 114 extending over the first ILD 86. The ILD masks 88 can also be removed by the planarization process, thus exposing the first ILD 86. Remaining portions of the gate mask layer 114 thus form gate masks 116 contacting top surfaces of the gate electrodes 102. Subsequently formed gate contacts penetrate through the gate masks 98 and/or 116 to contact the top surfaces of the gate electrodes 102.

Figure 20A:
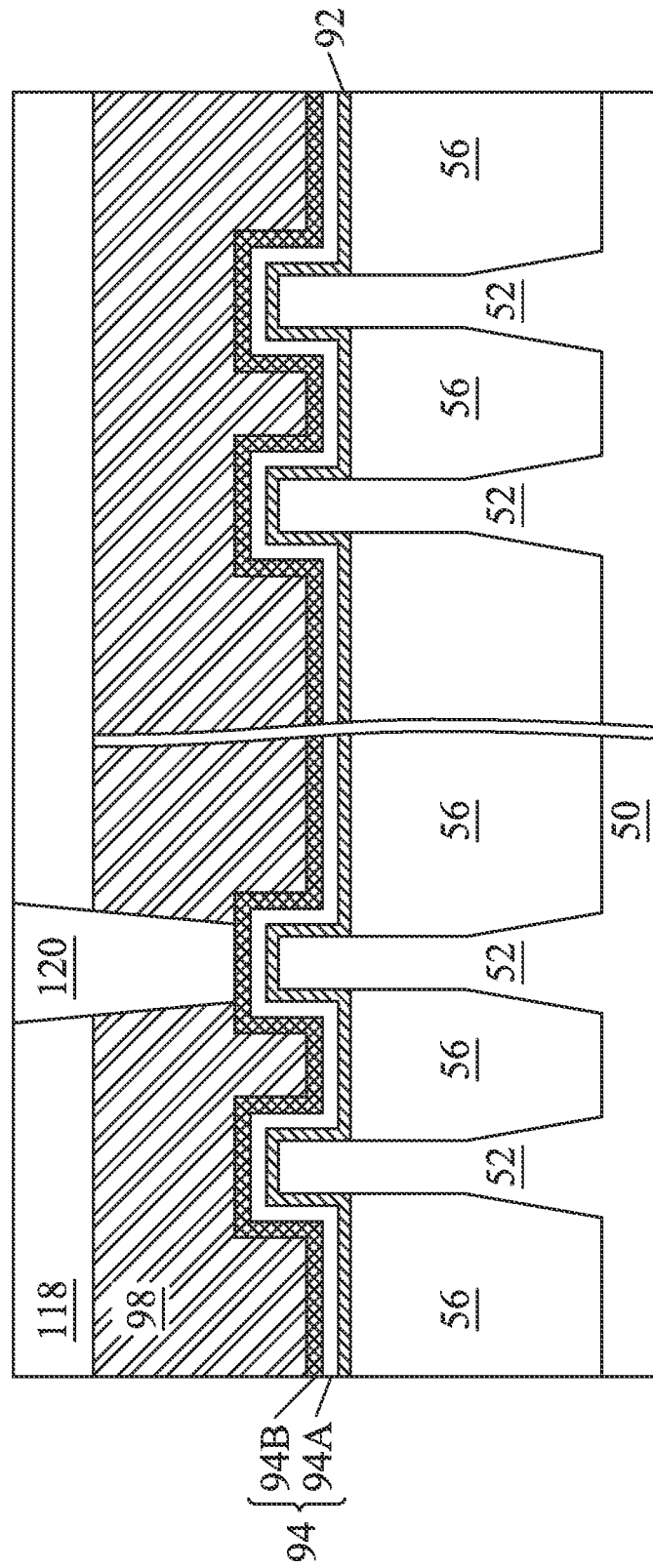
Figure 20B:
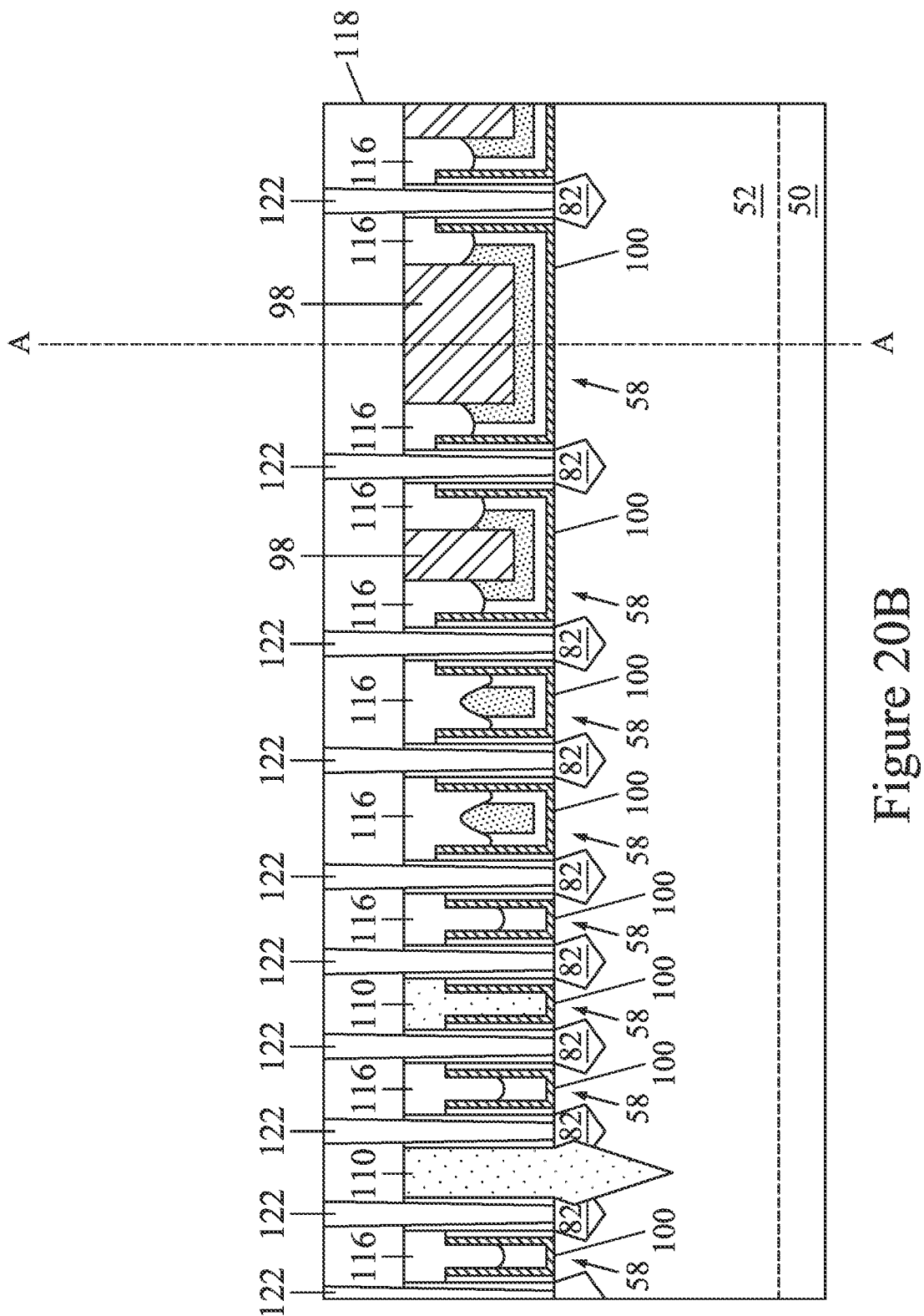

In FIGS. 20A and 20B, a second ILD 118 is deposited over the first ILD 86. In some embodiment, the second ILD 118 is a flowable film formed by a flowable CVD method. In some embodiments, the second ILD 118 is formed of a dielectric material such as PSG, BSG, BPSG, USG, or the like, and may be deposited by any suitable method, such as CVD and PECVD.

Gate contacts 120 and source/drain contacts 122 are then formed through the second ILD 118 and first ILD 86. Openings for the source/drain contacts 122 are formed through the first ILD 86 and second ILD 118, and openings for the gate contact 120 are formed through the second ILD 118 and the gate mask 98 and/or 116. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 118. The remaining liner and conductive material form the source/drain contacts 122 and gate contacts 120 in the openings. An anneal process may be performed to form a silicide at the interface between the epitaxial source/drain regions 82 and the source/drain contacts 122. The source/drain contacts 122 are physically and electrically coupled to the epitaxial source/drain regions 82, and the gate contacts 120 are physically and electrically coupled to the gate electrodes 102. The source/drain contacts 122 and gate contacts 120 may be formed in different processes, or may be formed in the same process. Although shown as being formed in the same cross-sections, it should be appreciated that each of the source/drain contacts 122 and gate contacts 120 may be formed in different cross-sections, which may avoid shorting of the contacts.

Figure 21A:
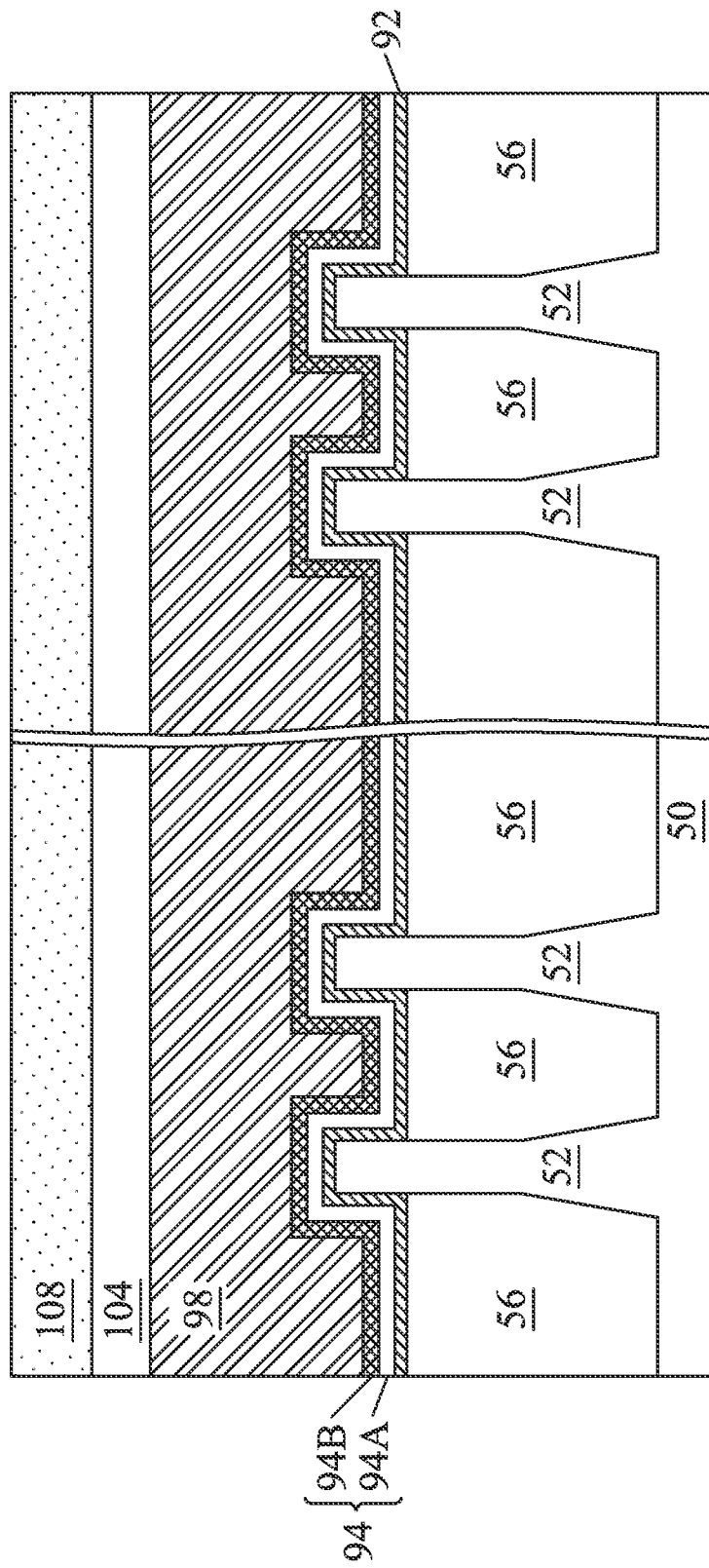
FIGS. 21A through 23B are various views of intermediate stages in the manufacturing of FinFETs, in accordance with some other embodiments.
Figure 21B:
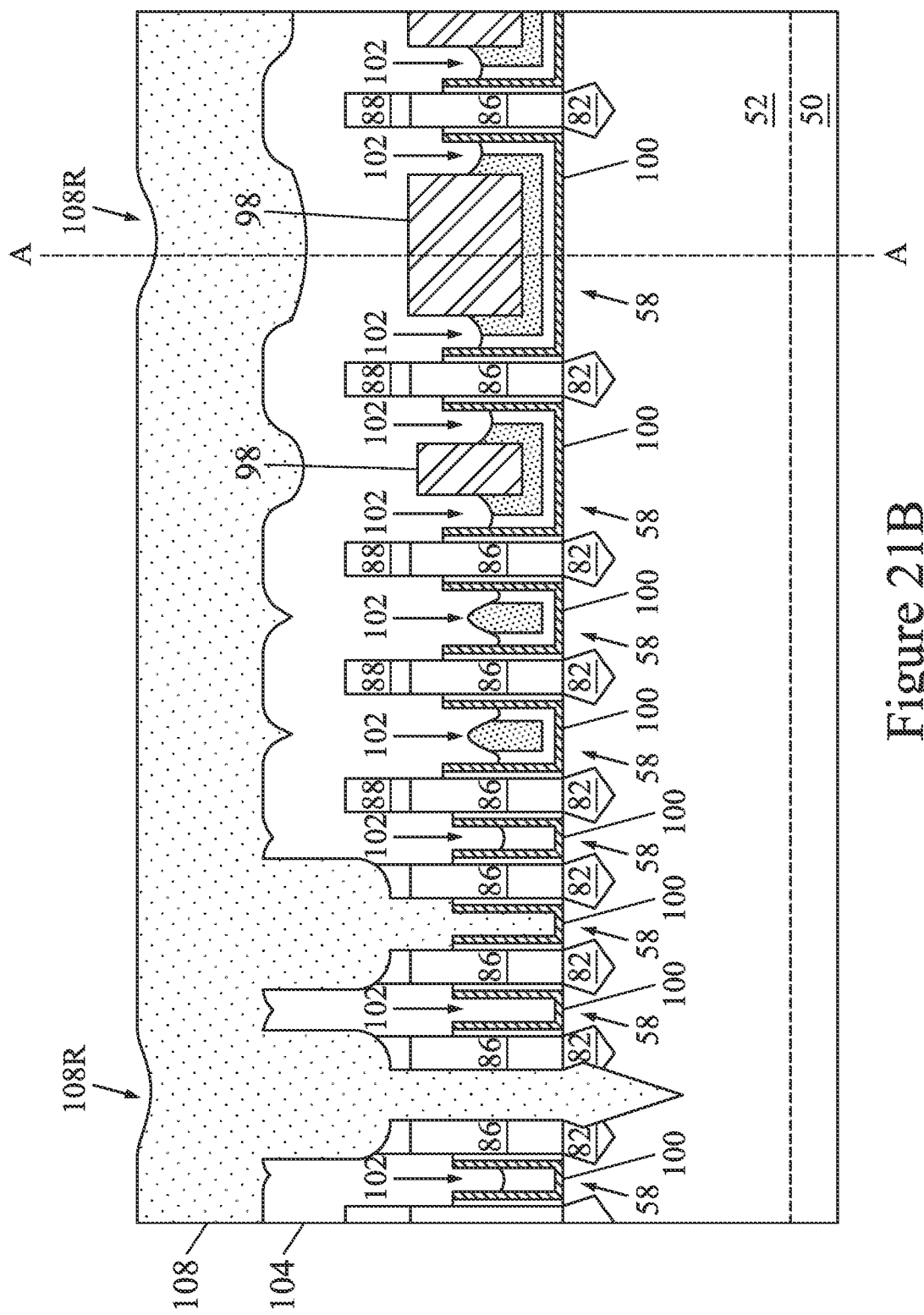
Figure 22A:
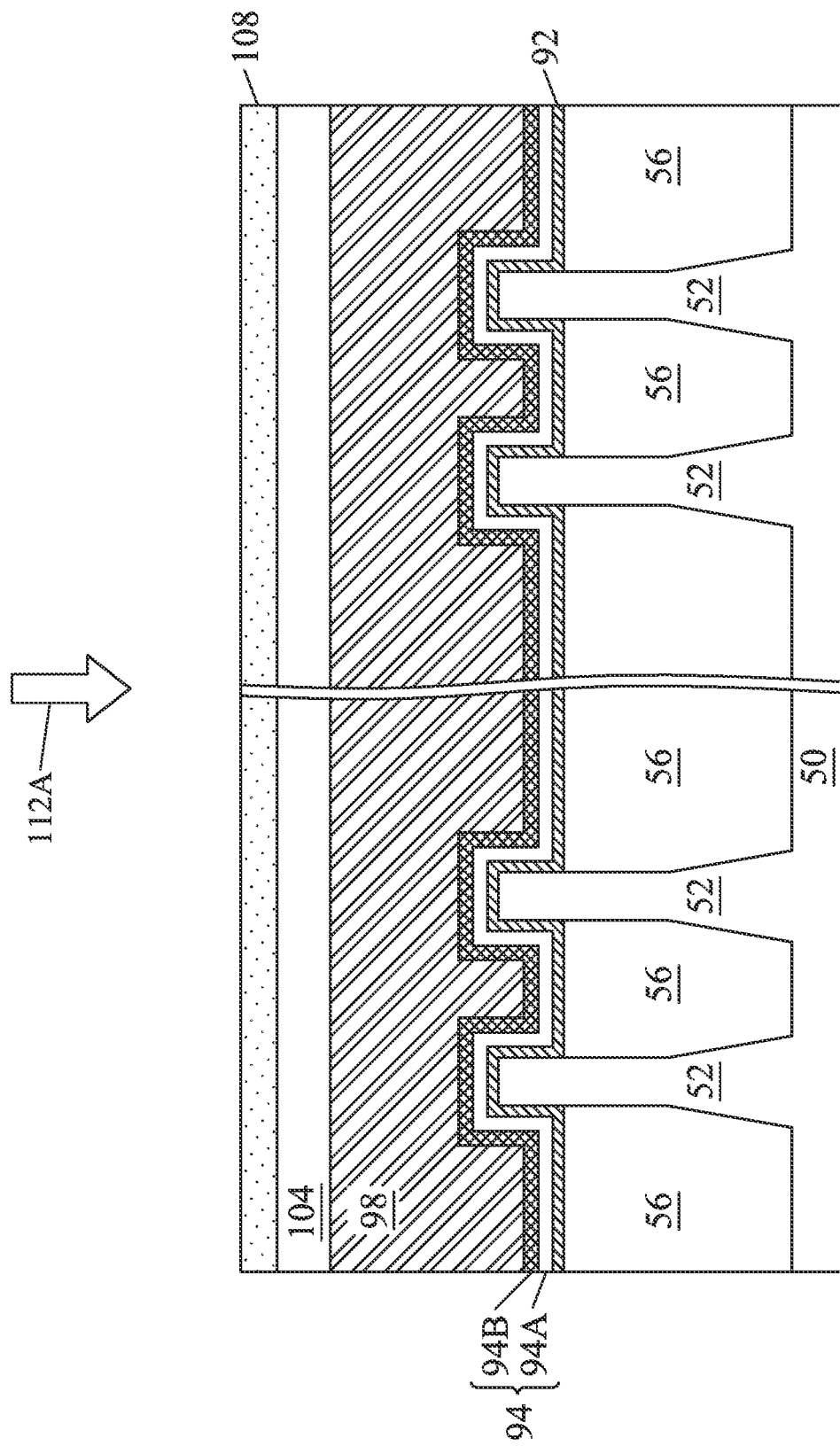
Figure 22B:
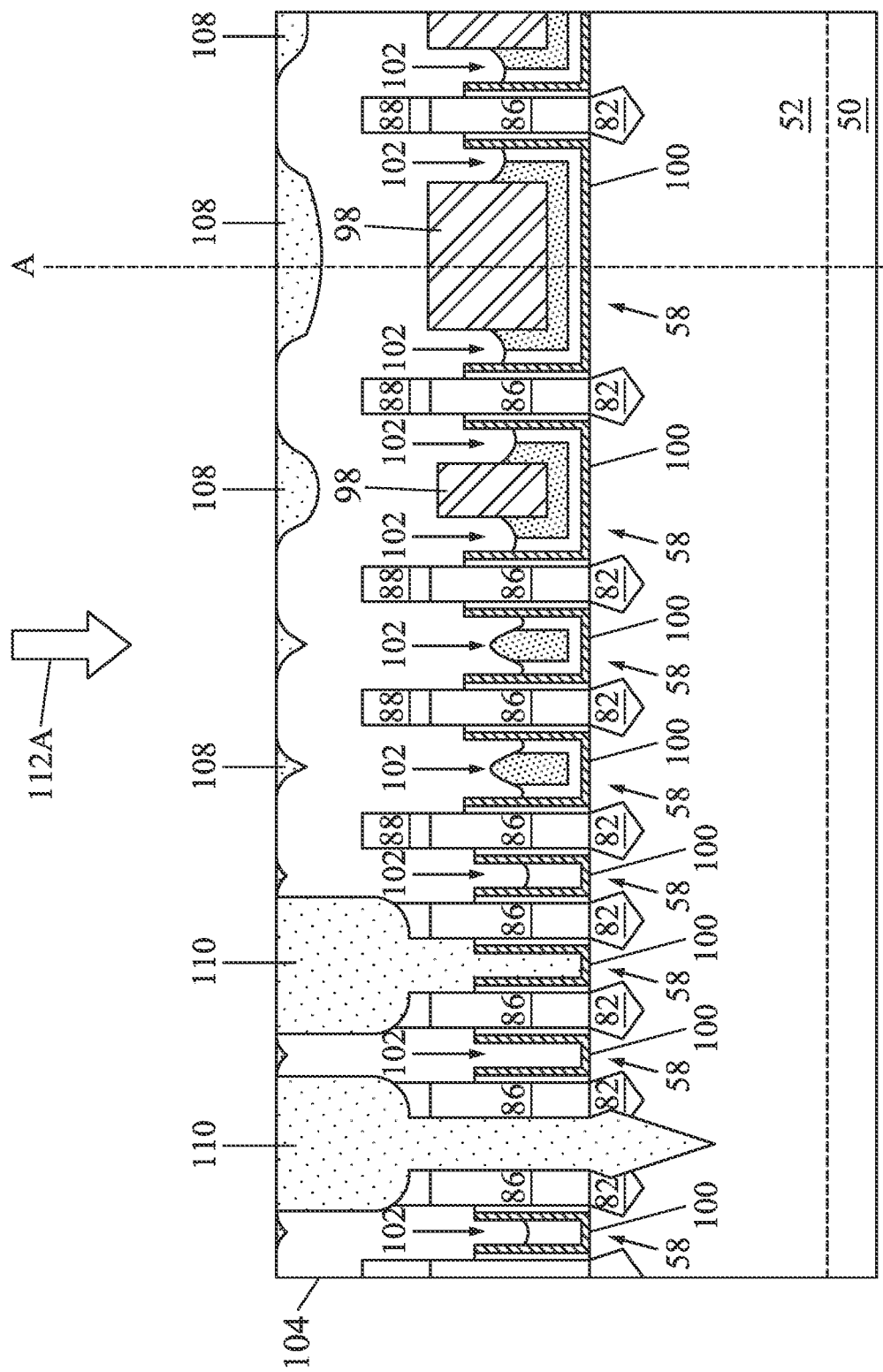
Figure 23A:
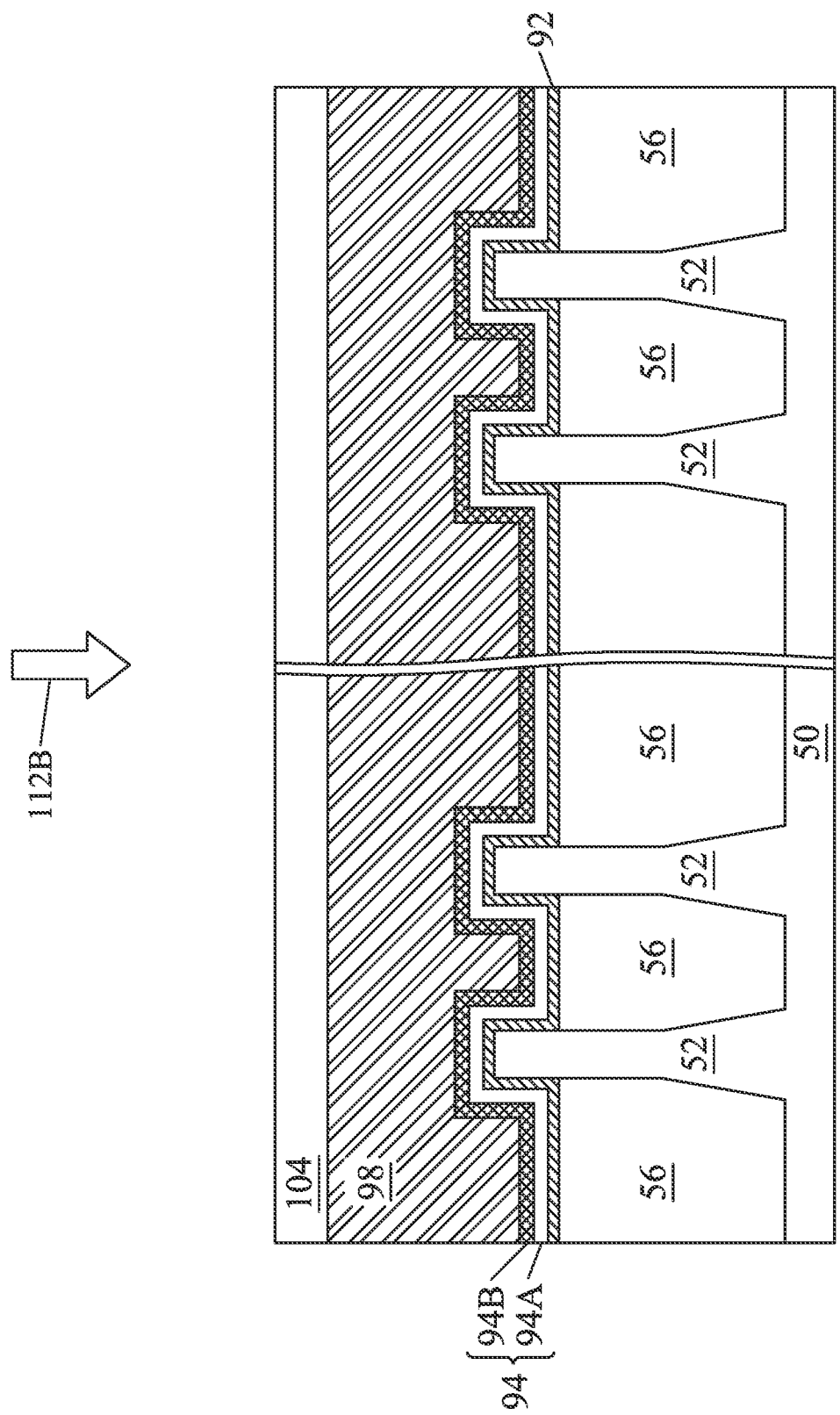
Figure 23B:
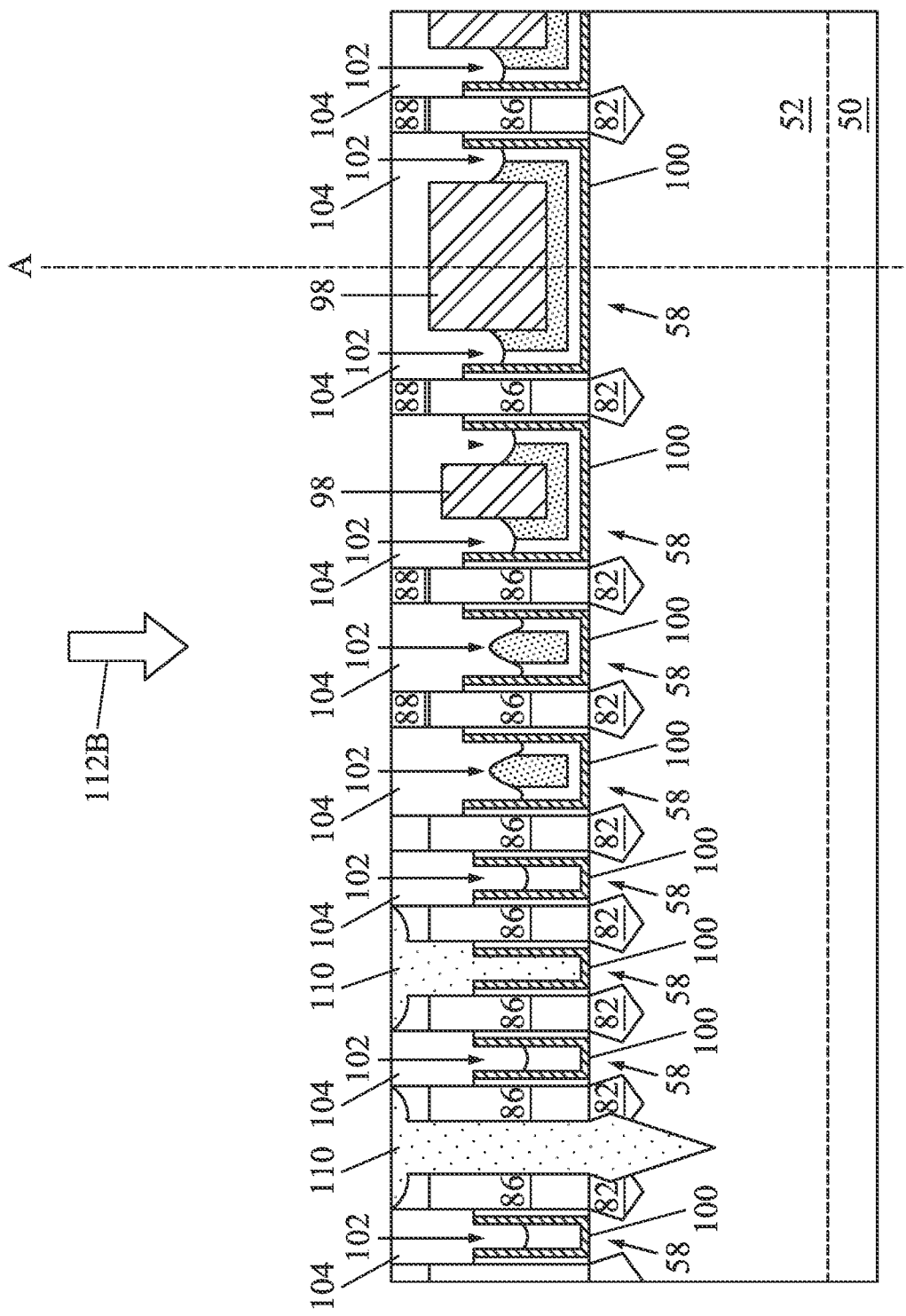

FIGS. 21A through 23B are various views of intermediate stages in the manufacturing of FinFETs, in accordance with some other embodiments. FIGS. 21A, 22A, and 23A are cross-sectional views illustrated along reference cross-section A-A illustrated in FIG. 1, except for multiple fins/FinFETs. FIGS. 21B, 22B, and 23B are cross-sectional views illustrated along reference cross-section B-B illustrated in FIG. 1, except for multiple fins/FinFETs.

FIGS. 21A and 21B illustrate the structure at a similar intermediate stage of processing as that shown in FIGS. 14A and 14B. In this embodiment, the top surfaces of the ILD masks 88 extend above the top surfaces of the gate masks 98. As such, in this embodiment, the second filling layer 108 also has recesses 108R over the gate masks 98.

In FIGS. 22A and 22B, the first planarization process 112A is performed to remove excess portions of the second filling layer 108, which excess portions are over the top surface of the first filling layer 104. Details about the first planarization process 112A are described above, and will not be repeated.

In FIGS. 23A and 23B, the second planarization process 112B is performed to remove excess portions of the first filling layer 104 and isolation features 110, which excess portions are over the top surface of the ILD masks 88. Details about the second planarization process 112B are described above, and will not be repeated. After the second planarization process 112B, the gate masks 98 remain covered by the remaining portions of the first filling layer 104. Further processing may then be performed as described above with respect to FIGS. 17A through 20B to form FinFET devices.

Figure 24A:
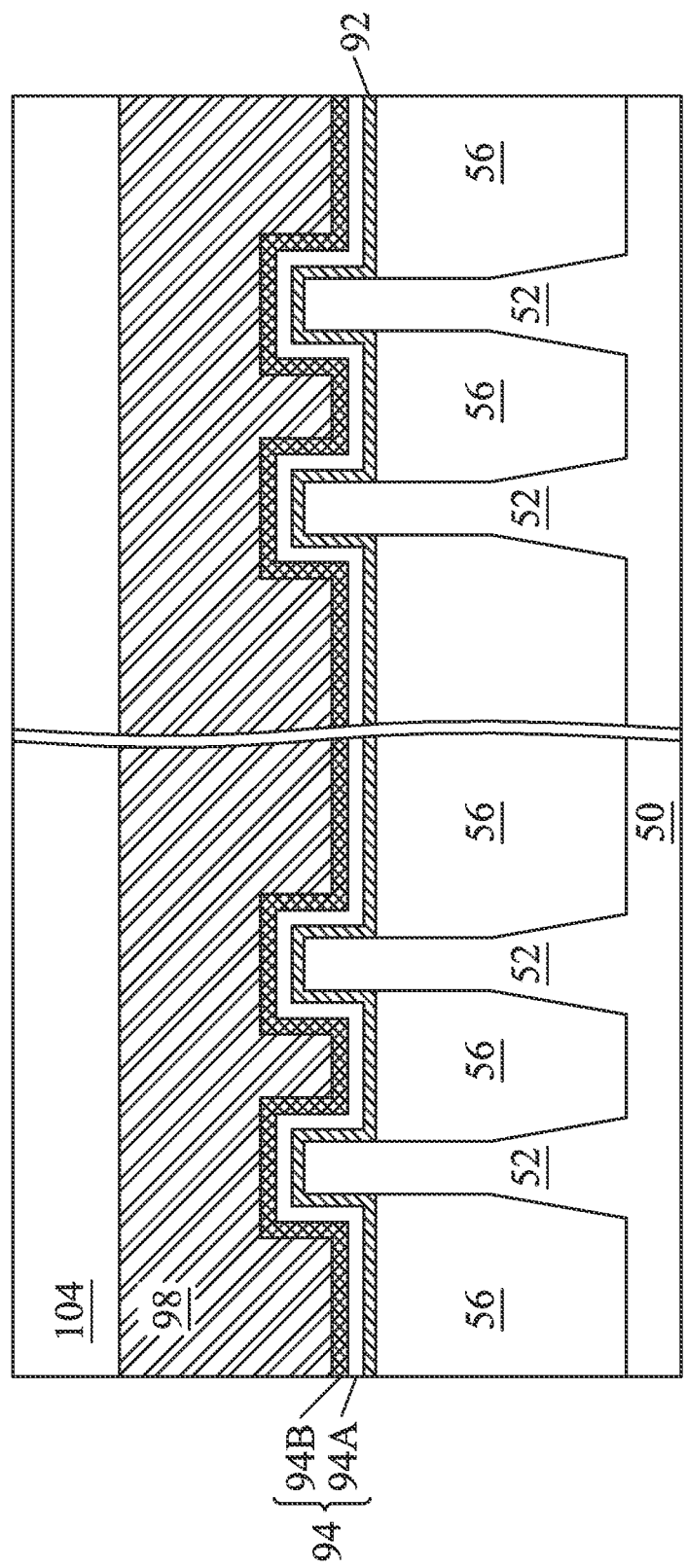
FIGS. 24A through 26B are various views of intermediate stages in the manufacturing of FinFETs, in accordance with some other embodiments.
Figure 24B:
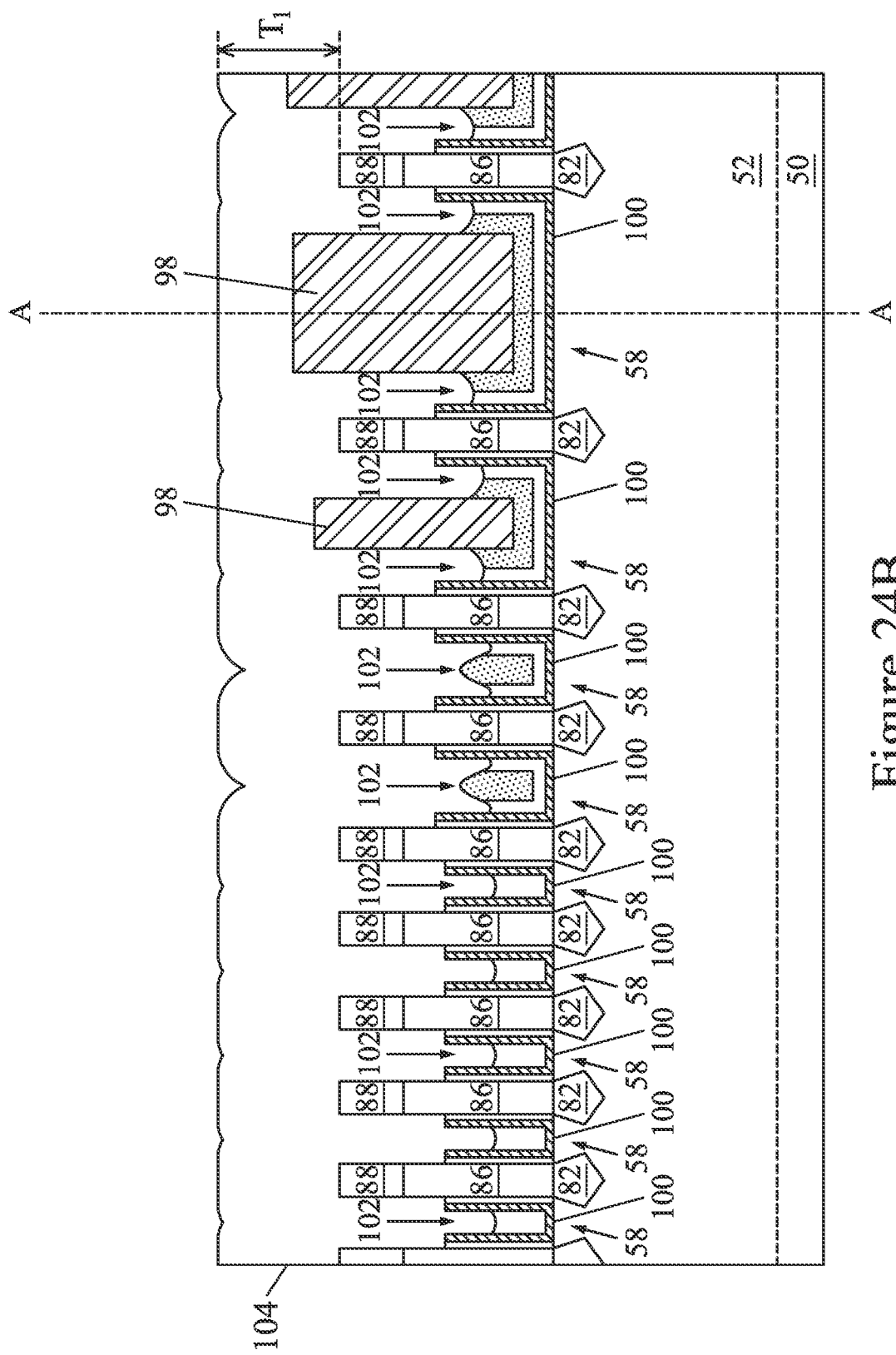
Figure 25A:
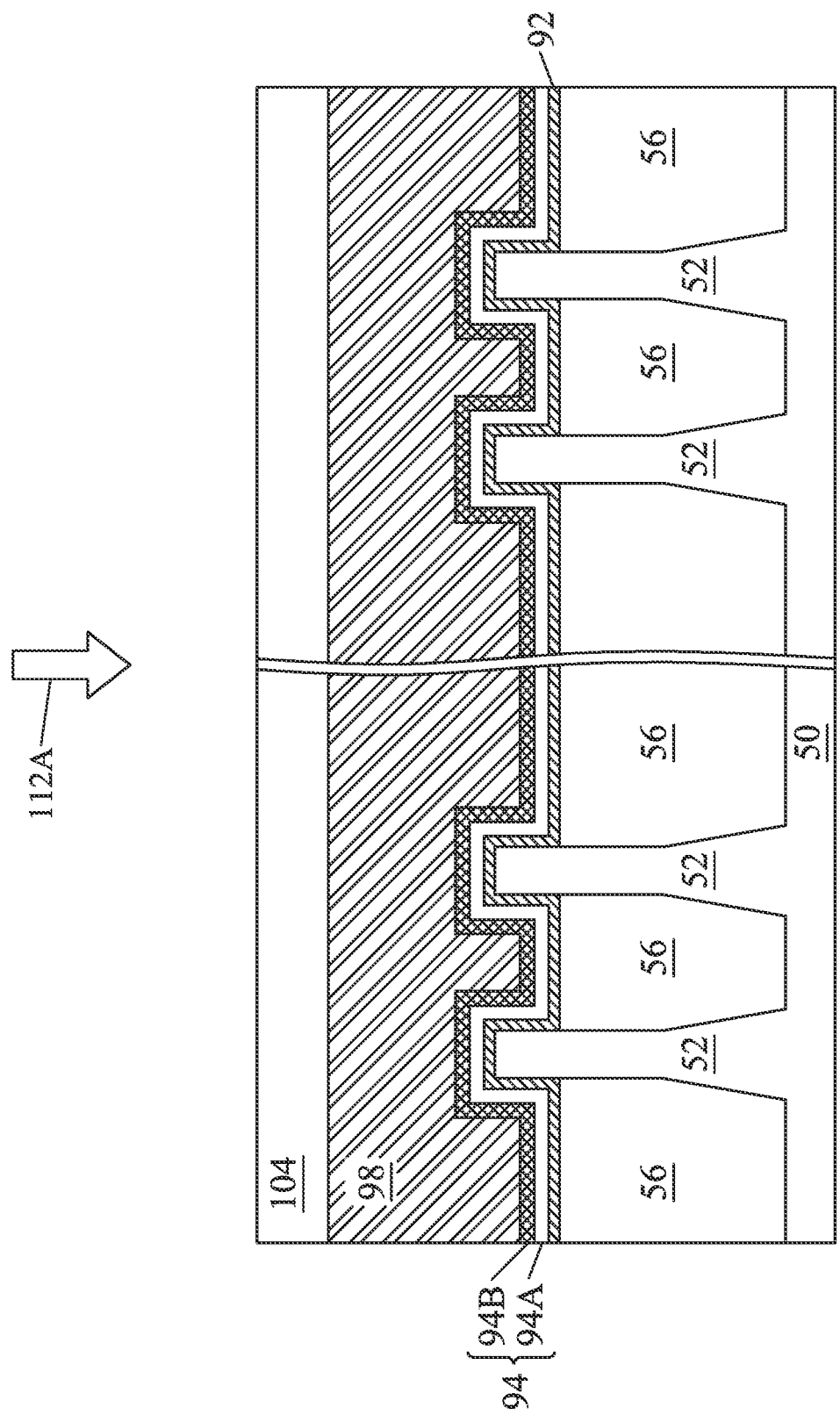
Figure 25B:
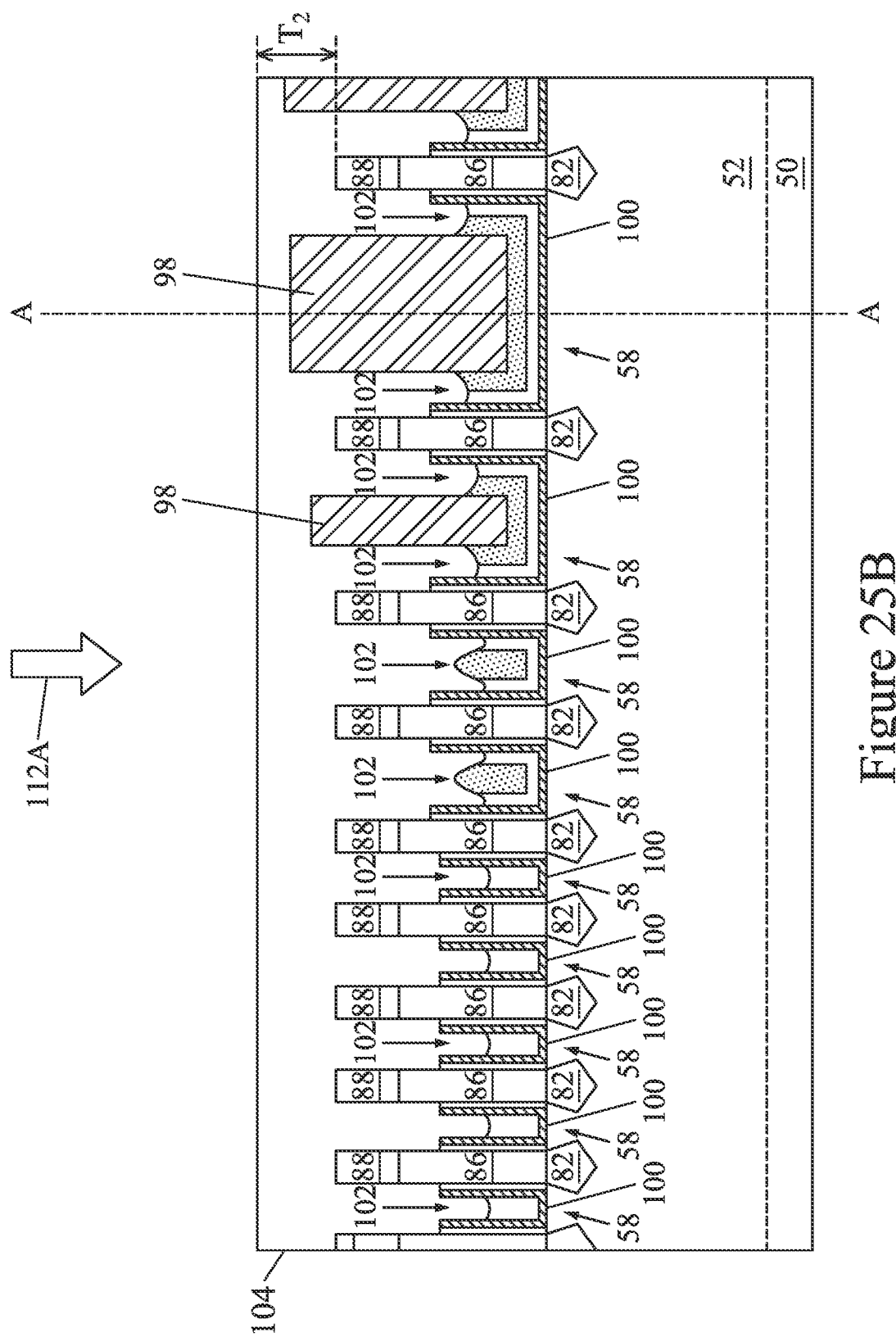
Figure 26A:
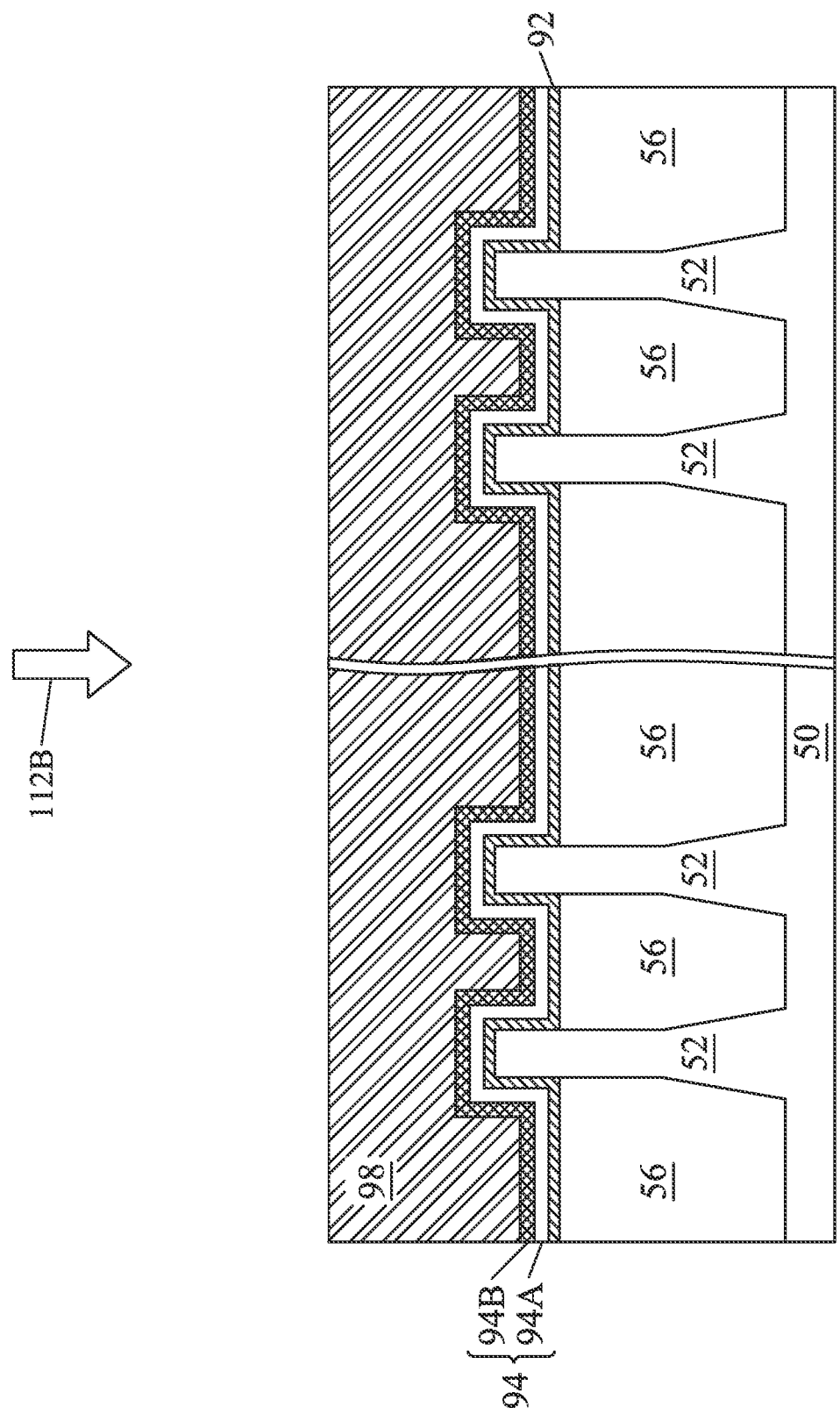
Figure 26B:
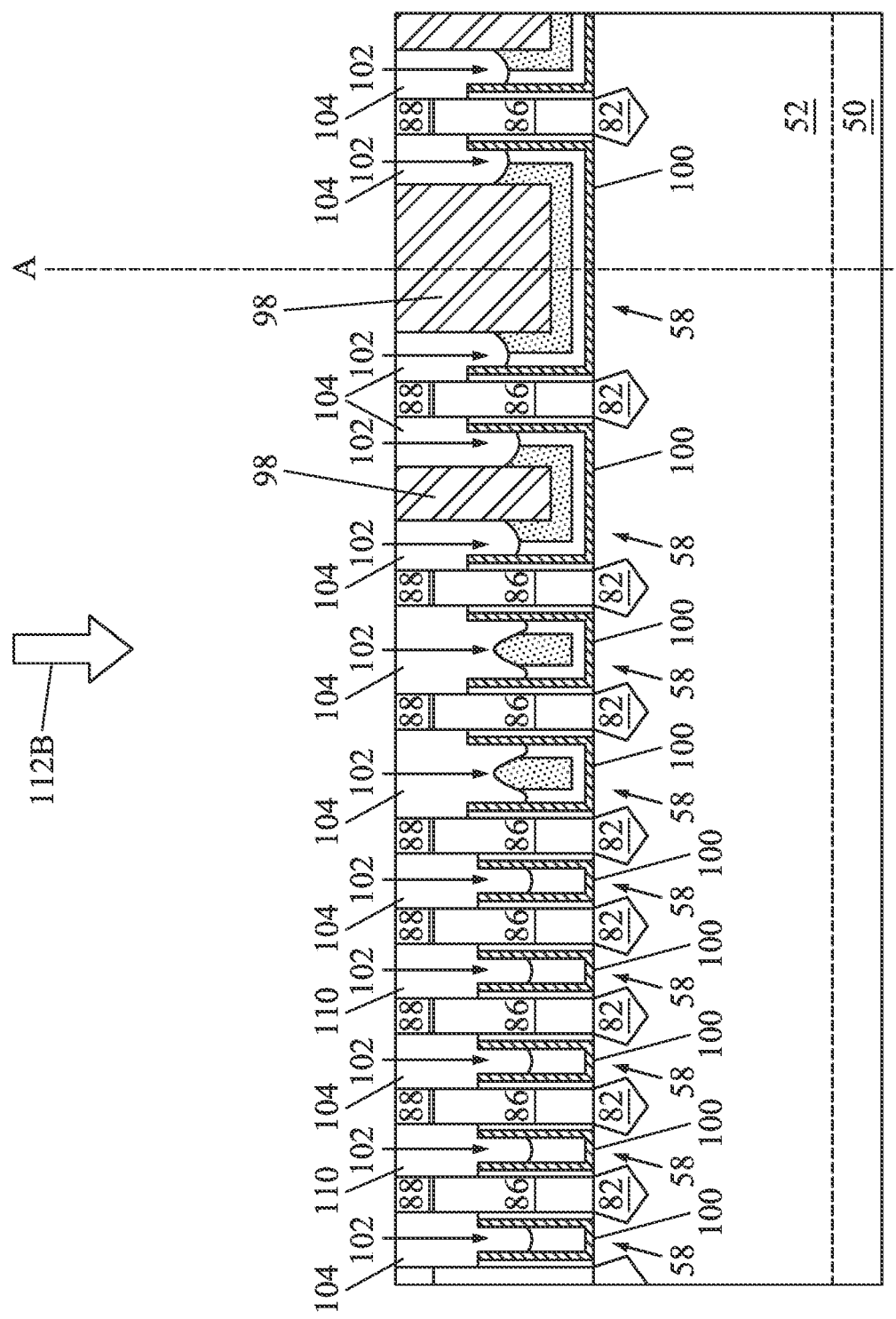

FIGS. 24A through 26B are various views of intermediate stages in the manufacturing of FinFETs, in accordance with some other embodiments. FIGS. 24A, 25A, and 26A are cross-sectional views illustrated along reference cross-section A-A illustrated in FIG. 1, except for multiple fins/FinFETs. FIGS. 24B, 25B, and 26B are cross-sectional views illustrated along reference cross-section B-B illustrated in FIG. 1, except for multiple fins/FinFETs.

FIGS. 24A and 24B illustrate the structure at a similar intermediate stage of processing as that shown in FIGS. 12A and 12B. In this embodiment, the openings 106 are not formed in the first filling layer 104. As such, the second filling layer 108 and isolation features 110 are not formed. The first filling layer 104 may be formed to a large average thickness $T_1$ above the ILD masks 88. For example, the average thickness $T_1$ can be in the range of about 200 Å to about 500 Å.

In FIGS. 25A and 25B, the first planarization process 112A is performed to planarize the top surface of the first filling layer 104. The first planarization process 112A is stopped while the first filling layer 104 remains over the underlying features. The first planarization process 112A may be performed until the first filling layer 104 has a small average thickness $T_2$ remaining above the ILD masks 88. For example, the average thickness $T_2$ can be in the range of about 30 Å to about 300 Å. The first planarization process 112A may be timed to ensure that it is stopped after a desired amount of material is removed, particularly when no CMP stop layers are used. For example, the first planarization process 112A can be performed for a duration in the range of about 50 seconds and about 120 seconds.

In FIGS. 26A and 26B, the second planarization process 112B is performed to remove excess portions of the first filling layer 104, which excess portions are over the top surface of the ILD masks 88. The second planarization process 112B may also remove portions of the ILD masks 88 and gate masks 98. Details about the second planarization process 112B are described above, and will not be repeated. Further processing may then be performed as described above with respect to FIGS. 17A through 20B to form FinFET devices.

Embodiments may achieve advantages. Due to pattern loading caused by channel regions 58 of differing lengths, the first filling layer 104 and second filling layer 108 may have uneven CMP removal rates. An increased surface roughness of the gate masks 98 caused by etching back the gate electrodes 102 may exacerbate the unevenness in CMP removal rates. Performing the first planarization process 112A (e.g., a CMP) helps initially reset the planarity of the structure. Performing the second planarization process 112B (e.g., an etch-back) helps transfer the reset planar topography to underlying features, such as the ILD 86 and gate masks 98. The planarization efficiency in subsequent processing may thus be improved. Further, forming the gate masks 98 for longer channel regions 58 can help reduce pattern loading effects during MEOL processing, reducing the chances of over/under etching when forming the gate contacts 120.

In an embodiment, a method includes: forming a fin extending from a substrate; forming a first gate mask over the fin, the first gate mask having a first width; forming a second gate mask over the fin, the second gate mask having a second width, the second width being greater than the first width; depositing a first filling layer over the first gate mask and the second gate mask; depositing a second filling layer over the first filling layer; planarizing the second filling layer with a chemical mechanical polish (CMP) process, the CMP process being performed until the first filling layer is exposed; and planarizing the first filling layer and remaining portions of the second filling layer with an etch-back process, the etch-back process etching materials of the first filling layer, the second filling layer, the first gate mask, and the second gate mask at the same rate.

In some embodiments, the method further includes: patterning a first interlayer dielectric (ILD) with a first opening and a second opening exposing the fin; forming ILD masks over the first ILD; depositing a gate dielectric layer in the first opening and the second opening; forming gate electrode layers on the gate dielectric layer; depositing a gate mask layer on the gate electrode layers; and planarizing the gate mask layer to form the first gate mask in the first opening and the second gate mask in the second opening. In some embodiments of the method, topmost surfaces of the first gate mask and the second gate mask extend above topmost surfaces of the ILD masks before the etch-back process. In some embodiments of the method, topmost surfaces of the first gate mask, the second gate mask, the ILD masks, and the first filling layer are level after the etch-back process. In some embodiments of the method, topmost surfaces of the ILD masks extend above topmost surfaces of the first gate mask and the second gate mask before the etch-back process. In some embodiments of the method, topmost surfaces of the ILD masks and the first filling layer are level after the etch-back process, and the first filling layer covers the first gate mask and the second gate mask after the etch-back process. In some embodiments, the method further includes: etching back the gate electrode layers and the gate dielectric layer to form a first gate dielectric and a first gate electrode in the first opening, and to form a second gate dielectric and a second gate electrode in the second opening. In some embodiments, the method further includes: after the etch-back process, removing the first filling layer to expose portions of the first gate electrode and the second gate electrode, the first gate mask and the second gate mask, respectively, remaining over unexposed portions of the first gate electrode and the second gate electrode. In some embodiments, the method further includes: forming a third gate mask over the exposed portions of the first gate electrode; and forming a fourth gate mask over the exposed portions of the second gate electrode.

In an embodiment, a method includes: forming a fin extending from a substrate; forming a first gate mask over the fin, the first gate mask having a first width; forming a second gate mask over the fin, the second gate mask having a second width, the second width being greater than the first width; depositing a filling layer over the first gate mask and the second gate mask; planarizing the filling layer with a chemical mechanical polish (CMP) process; and after the CMP process, planarizing the filling layer with an etch-back process, the etch-back process etching materials of the filling layer, the first gate mask, and the second gate mask at the same rate.

In some embodiments, the method further includes: forming a first interlayer dielectric (ILD) over the fin; patterning the first ILD with a first opening and a second opening; forming the first gate mask in the first opening and the second gate mask in the second opening; and forming ILD masks over the first ILD. In some embodiments of the method, after the etch-back process, topmost surfaces of the ILD masks and the filling layer are level. In some embodiments of the method, after the etch-back process, topmost surfaces of the first gate mask and the second gate mask are level with the topmost surfaces of the ILD masks and the filling layer. In some embodiments of the method, after the etch-back process, the filling layer covers the first gate mask and the second gate mask.

In an embodiment, a method includes: forming a fin extending from a substrate; forming a first gate stack over a first channel region of the fin; forming a second gate stack over a second channel region of the fin, the second channel region of the fin having a different length than the first channel region of the fin; depositing a first filling layer over the first gate stack and the second gate stack; patterning the first filling layer; etching an opening in the first gate stack using the patterned first filling layer as an etching mask; depositing a second filling layer in the opening and over the first filling layer; polishing the second filling layer until portions of the first filling layer are exposed; and etching the first filling layer and remaining portions of the second filling layer with a non-selective etch-back process, topmost surfaces of the first filling layer and the remaining portions of the second filling layer being level after the non-selective etch-back process.

In some embodiments of the method, the non-selective etch-back process is a dry etch performed in an oxygen-free environment. In some embodiments of the method, the dry etch is performed with a gas source including $NF_3$, $H_2$, and Ar. In some embodiments of the method, a ratio of $NF_3$ to $H_2$ in the gas source is in a range of 0.5:1 to 1.125:1. In some embodiments of the method, the dry etch is performed by generating a plasma with the gas source, the plasma being generated with RF power in a range of 200 W to 1000 W, at a pressure in a range of 200 mT to 2500 mT, and at a temperature in a range of 15° C. to 85° C. In some embodiments of the method, the first filling layer is formed of silicon, the second filling layer is formed of silicon nitride, and the etching rate ratio of silicon nitride to silicon for the non-selective etch-back process is in a range of 0.9 to 1.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dielectric material over a source/drain region;
    forming a first gate mask adjacent to the dielectric material and the source/drain region;
    depositing a first filling layer over the first gate mask and the dielectric material;
    depositing a second filling layer over the first filling layer;
    planarizing the second filling layer with a chemical mechanical polish process, the chemical mechanical polish process being performed until the first filling layer is exposed; and
    planarizing the first filling layer and remaining portions of the second filling layer with an etch-back process, the etch-back process etching materials of the first filling layer and the second filling layer at the same rate, wherein a top surface of the first filling layer is level with a top surface of the dielectric material after the etch-back process.

2. The method of claim 1, wherein a top surface of the first gate mask extends above the top surface of the dielectric material before the etch-back process.

3. The method of claim 2, wherein a top surface of the first gate mask is level with the top surface of the dielectric material after the etch-back process.

4. The method of claim 1, wherein the top surface of the dielectric material extends above a top surface of the first gate mask before the etch-back process.

5. The method of claim 4, wherein the first filling layer is over the first gate mask after the etch-back process.

6. The method of claim 1, wherein the first gate mask is formed on a gate electrode, the method further comprising:
    replacing a portion of the first filling layer with a second gate mask on the gate electrode.

7. The method of claim 1, wherein the first filling layer acts as a chemical mechanical polish stop layer for the chemical mechanical polish process.

8. A method comprising:
    forming a dielectric material over a first source/drain region and a second source/drain region;
    forming a first gate mask and a second gate mask adjacent to the first source/drain region and the second source/drain region, respectively, the first gate mask having a first width, the second gate mask having a second width, the second width being different from the first width;
    depositing a filling material over the first gate mask, the second gate mask, and the dielectric material;
    planarizing the filling material with a chemical mechanical polish process; and
    after the chemical mechanical polish process, planarizing the filling material with an etch-back process, the etch-back process etching the filling material and the dielectric material at the same rate, wherein top surfaces of the filling material and the dielectric material are level after the etch-back process.

9. The method of claim 8 further comprising:
replacing the filling material with a third gate mask and a fourth gate mask adjacent to the first source/drain region and the second source/drain region, respectively.

10. The method of claim 8, wherein the filling material is silicon.

11. The method of claim 8, wherein top surfaces of the first gate mask and the second gate mask are level with the top surfaces of the dielectric material and the filling material after the etch-back process.

12. The method of claim 8, wherein the filling material is over top surfaces of the first gate mask and the second gate mask after the etch-back process.

13. A method comprising:
patterning a dielectric material with a first opening;
forming a first gate structure in the first opening;
depositing a first filling layer over the first gate structure and the dielectric material;
planarizing the first filling layer with a chemical mechanical polish process, wherein the first filling layer is over the dielectric material after the chemical mechanical polish process;
planarizing the first filling layer with an etch-back process, wherein top surfaces of the dielectric material and the first filling layer are level after the etch-back process;
replacing a portion of the first filling layer over the first gate structure with a gate mask; and
forming a gate contact through the gate mask to contact the first gate structure.

14. The method of claim 13 further comprising:
patterning the first filling layer and the first gate structure with a second opening;
depositing a second filling layer in the second opening and over the first filling layer; and
planarizing the second filling layer with the chemical mechanical polish process.

15. The method of claim 14, wherein the first filling layer comprises silicon and the second filling layer comprises silicon nitride.

16. The method of claim 13, wherein the etch-back process is a dry etch performed in an oxygen-free environment.

17. The method of claim 16, wherein the dry etch is performed with $NF_3$ and $H_2$.

18. The method of claim 13 further comprising:
patterning the dielectric material with a second opening;
forming a second gate structure in the second opening, the first gate structure having a first width, the second gate structure having a second width, the second width being greater than the first width; and
depositing the first filling layer over the second gate structure.

19. The method of claim 18, wherein the first gate structure is disposed on a semiconductor fin and the second gate structure is disposed on the semiconductor fin.

20. The method of claim 13 further comprising:
depositing the dielectric material on an interlayer dielectric.

* * * * *